(12) United States Patent
Lin

(10) Patent No.: US 6,451,626 B1
(45) Date of Patent: Sep. 17, 2002

(54) THREE-DIMENSIONAL STACKED SEMICONDUCTOR PACKAGE

(76) Inventor: Charles W.C. Lin, 34 Pinewood Grove, Singapore (SG), 738290

( * ) Notice: Subject to any disclaimer, the term of this patent is extended or adjusted under 35 U.S.C. 154(b) by 0 days.

(21) Appl. No.: 09/917,358

(22) Filed: Jul. 27, 2001

(51) Int. Cl.[7] .......................... H01L 23/02; H01L 23/48; H01L 23/52; H01L 23/34; H01L 23/44
(52) U.S. Cl. .................... 438/108; 257/686; 257/690; 257/695; 257/724; 257/777
(58) Field of Search .................. 438/426, 368, 438/108; 257/686, 690, 695, 724, 777

(56) References Cited

U.S. PATENT DOCUMENTS

| | | | |
|---|---|---|---|
| 4,706,166 A | 11/1987 | Go | 361/403 |
| 4,807,021 A | 2/1989 | Okumura | 357/75 |
| 4,897,708 A | 1/1990 | Clements | 357/65 |
| 4,954,875 A | 9/1990 | Clements | 357/75 |
| 4,984,358 A | 1/1991 | Nelson | 29/830 |
| 4,996,583 A | 2/1991 | Hatada | 357/70 |
| 5,049,979 A | 9/1991 | Hashemi et al. | 357/75 |
| 5,104,820 A | 4/1992 | Go et al. | 437/51 |
| 5,138,438 A | 8/1992 | Masayuki et al. | 357/75 |
| 5,332,922 A | 7/1994 | Oguchi et al. | 257/723 |
| 5,394,303 A | 2/1995 | Yamaji | 361/749 |
| 5,484,959 A | 1/1996 | Burns | 174/524 |
| 5,514,907 A | 5/1996 | Moshayedi | 257/723 |
| 5,625,221 A | 4/1997 | Kim et al. | 257/686 |
| 5,744,827 A | 4/1998 | Jeong et al. | 257/686 |
| 5,804,874 A | 9/1998 | An et al. | 257/676 |
| 5,854,507 A | 12/1998 | Miremadi et al. | 257/686 |
| 5,861,666 A | 1/1999 | Bellaar | 257/686 |
| 5,877,478 A * | 3/1999 | Ando | 257/685 |
| 5,910,685 A | 6/1999 | Watanabe et al. | 257/777 |
| 5,973,393 A | 10/1999 | Chia et al. | 257/690 |
| 6,072,233 A | 6/2000 | Corisis et al. | 257/686 |
| 6,084,294 A * | 7/2000 | Tomita | 257/476 |
| 6,124,633 A | 9/2000 | Vindasius et al. | 257/685 |

* cited by examiner

*Primary Examiner*—David E. Graybill
(74) *Attorney, Agent, or Firm*—David M. Sigmond

(57) ABSTRACT

A three-dimensional stacked semiconductor package includes first and second semiconductor chip assemblies and a conductive bond. The first semiconductor chip assembly includes a first semiconductor chip and a first conductive trace with a first routing line and a first pillar. The second semiconductor chip assembly includes a second semiconductor chip and a second conductive trace with a second routing line and a second pillar. The chips are aligned with one another, and the pillars are disposed outside the peripheries of the chips and aligned with one another. The conductive bond contacts and electrically connects the pillars.

90 Claims, 13 Drawing Sheets

THREE-DIMENSIONAL STACKED SEMICONDUCTOR PACKAGE

BACKGROUND OF THE INVENTION

1. Field of the Invention

The present invention relates to semiconductor packaging, and more particularly to a three-dimensional stacked semiconductor package with multiple semiconductor chips.

2. Description of the Related Art

In the field of electronic systems, there is a continuous need to increase performance and reduce size. This is largely achieved by improving semiconductor wafer manufacturing and semiconductor packaging technologies. Wafer manufacturing involves simultaneously fabricating numerous semiconductor chips as a batch on a silicon wafer using various etching, doping and depositing steps. After the wafer is complete, the chips are separated from one another and packaged.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance.

Semiconductor chips have input/output pads that must be connected to external circuitry in order to function as part of an electronic system. Traditionally, a single chip is individually housed in a single-chip package that is connected to other single-chip packages through a printed circuit board (or motherboard) which supplies power to the chips and provides signal routing among the chips. The single-chip package has connection media that is typically an array of metallic leads (e.g., a lead frame) or a support circuit (e.g., a substrate).

Several connection techniques are widely used for connecting the chip pads and the connection media. These include wire bonding, tape automated bonding (TAB) and flip-chip bonding. Wire bonding is by far the most common. In this approach, wires are bonded, one at a time, from the chip to external circuitry by thermocompression, thermosonic or ultrasonic processes. TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface. Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Many variations exist on these basic methods.

A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used. While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Thus, none of these conventional connection techniques are entirely satisfactory.

Conventional single-chip packages typically have an area (or footprint) that is many times larger than the area of the chip, causing the printed circuit board to have excessively large area relative to the chips. However, as chip speeds increase, it becomes critical to position the chips close together since excessive signal transmission distance deteriorates signal integrity and propagation times. Other considerations such as manufacturing cost, reliability, heat transfer, moisture resistance, mounting and interconnect standardization, testability, and quality control have also become focal points of chip packaging.

Single-chip packages such as ball grid arrays (BGA) and chip scale packages (CSP) have been recently developed to address these considerations. Although these packages provide certain advantages, further size reduction and performance enhancement with these packages has been difficult to obtain due to physical dimension, design and manufacturing constraints.

Multichip modules (MCM) or hybrid modules that package multiple chips on a common platform are an alternative to single-chip packages. These modules aim to achieve higher packaging density (lower volume and mass per chip), better signal integrity and reasonable manufacturing cost. Conventional multichip modules are essentially two-dimensional structures with multiple chips connected to a planar interconnection substrate which contains traces to supply power and signal transmission. Co-fired ceramic substrates have given way to organic-based substrates due to performance and cost advantages. However, since multichip modules utilize a planar interconnection substrate as the base, their effectiveness in packaging density is limited. For instance, a substrate transmission line that is 25 microns wide, 5 microns high and 10 millimeters long creates high line resistance and signal delays, which necessitates complex wiring rules in order to provide acceptable signal transmission distances and reasonable propagation delays.

Therefore, in order to create higher density packages, reduce area requirements and shorten signal transmission distances, three-dimensional packages with two, three or more vertically stacked chips are an emerging trend. Three-dimensional packages are particularly suitable for the electronic systems such as supercomputers and large cache memory devices which require high operating speed and high capacity in very limited space.

Three-dimensional packages generally follow two approaches. In one approach, individual chips are packaged in conventional single-chip packages and then the single-chip packages are vertically stacked and interconnected to one another. Single-chip packages stacked this way include thin small-outline packages (TSOP), ball grid arrays (BGA)

and tape chip packages (TCP), and chip connections within the single-chip packages include wire bonding, TAB and flip-chip bonding. In another approach, leads are connected to the chips, and then the exposed leaded chips are vertically stacked and interconnected to one another. Most three-dimensional packages involve peripheral interconnection, but some provide area array interconnection. Numerous three-dimensional packages are reported in the literature.

U.S. Pat. Nos. 5,484,959, 5,514,907, 5,625,221 and 5,744,827 disclose three-dimensional packages in which stacked single-chip packages have large footprints that require large amounts of space. The single-chip packages also have long extended leads and associated wire bonds that limit electrical performance.

U.S. Pat. Nos. 5,854,507 and 6,072,233 disclose three-dimensional packages with stacked single-chip packages in which solder balls provide the primary vertical interconnections. The solder balls require large amounts of space.

U.S. Pat. No. 5,394,303 discloses a three-dimensional package in which the stacked single-chip packages include a flexible film with wiring layers wrapped around the chip. The flexible film is relatively difficult to wrap and bending the wiring layers causes low yields.

U.S. Pat. Nos. 4,996,583, 5,138,438 and 5,910,685 disclose three-dimensional packages in which TAB leads are connected to and extend beyond the peripheries of the chips, the exposed chips are stacked together and the TAB leads are connected together. The TAB leads for different chips have different shapes and lengths which complicates manufacturing. Furthermore, the TAB leads are interconnected by applying thermocompression, which also complicates manufacturing.

U.S. Pat. Nos. 4,706,166 and 5,104,820 disclose three-dimensional packages in which chips are formed with leads that extend to the sidewalls, the exposed chips are stacked together, and then thin film routing lines are deposited on the sidewalls to interconnect the leads. The wafer process must be modified, and aligning the sidewalls and forming the routing lines on the leads is difficult.

U.S. Pat. Nos. 4,897,708 and 4,954,875 disclose three-dimensional packages composed of wafers rather than individual chips. Cone-shaped vias are formed in the wafers, electrically conductive material is filled in the vias which contacts the pads on the wafers, and the wafers are stacked such that the electrically conductive material in the vias provides vertical interconnections between the pads. The wafer stacks are difficult to separate for repairs and too large for many applications.

Another drawback with many conventional three-dimensional packages is that the vertical interconnections lack the flexibility to accommodate thickness variations of the stacked assemblies. For instance, chip thickness may vary by 20 microns or more even after back-side wafer polishing attempts to planarize the wafer. As a result, vertical interconnections with fixed heights cannot adequately accommodate these thickness variations, and suffer from disoriented, cracked and open connections, high mechanical stress and reliability problems.

In summary, conventional three-dimensional packages suffer from numerous deficiencies including large area requirements, inflexible vertical interconnections, limited electrical performance, poor structural strength and low reliability. Moreover, conventional three-dimensional packages are often unsuitable for test and repair, manufactured by complicated processes that are impractical for volume production, and too difficult and costly to develop.

In view of the various development stages and limitations in currently available three-dimensional packages, there is a need for a three-dimensional package that is cost-effective, reliable, manufacturable, and provides excellent mechanical and electrical performance.

SUMMARY OF THE INVENTION

An object of the present invention is to provide a three-dimensional stack of semiconductor chip assemblies that provides a low cost, high performance, high reliability package. Another object of the present invention is to provide a convenient, cost-effective method for stacking semiconductor chip assemblies.

In accordance with one aspect of the invention, a three-dimensional stacked semiconductor package includes first and second semiconductor chip assemblies and a conductive bond. The first assembly includes a first chip and a first conductive trace. The first chip includes first and second opposing surfaces, the first surface of the first chip includes a first conductive pad, the first conductive trace includes a first routing line and a first pillar, the first routing line extends within and outside a periphery of the first chip and is electrically connected to the first pad, the first pillar includes first and second opposing surfaces and is disposed outside the periphery of the first chip and does not extend to the second surface of the first chip, and the first surface of the first pillar faces away from the first surface of the first chip. The second assembly includes a second chip and a second conductive trace. The second chip includes first and second opposing surfaces, the first surface of the second chip includes a second conductive pad, the second conductive trace includes a second routing line and a second pillar, the second routing line extends within and outside a periphery of the second chip and is electrically connected to the second pad, the second pillar includes first and second opposing surfaces and is disposed outside the periphery of the second chip and does not extend to the second surface of the second chip, and the first surface of the second pillar faces away from the first surface of the second chip. The first surface of the first chip faces the second surface of the second chip, the first surface of the first pillar faces the second surface of the second pillar, and the conductive bond contacts and electrically connects the first and second pillars.

Preferably, the first routing line is essentially flat and coplanar with the first surface of the first chip and overlaps the first pad, the second routing line is essentially flat and coplanar with the first surface of the second chip and overlaps the second pad, the first pillar is located at a distal end of the first routing line and does not extend to the first surface of the first chip, the second pillar is located at a distal end of the second routing line and does not extend to the first surface of the second chip, and the first surface of the first pillar is essentially coplanar with the first surface of the second chip.

It is also preferred that the first pillar has a conical shape with a diameter that increases from its first surface to its second surface, the second pillar has a conical shape with a diameter that increases from its first surface to its second surface, the first surface of the first pillar is concentrically disposed within a surface area of the second surface of the first pillar, the first surface of the second pillar is concentrically disposed within a surface area of the second surface of the second pillar, and the first surface of the first pillar is concentrically disposed within the surface area of the second surface of the second pillar.

It is further preferred that the first and second assemblies have essentially identical shapes and sizes, the conductive bond is solder, and the package is devoid of wire bonds and TAB leads.

In accordance with another aspect of the invention, a method of manufacturing the package includes positioning the first and second assemblies such that the first surface of the first chip faces the second surface of the second chip, the first surface of the first pillar faces the second surface of the second pillar and a bonding material is disposed between and contacts the first surface of the first pillar and the second surface of the second pillar, then moving the assemblies towards one another while the bonding material is non-solidified such that the first surface of the first chip moves towards the second surface of the second chip, the first surface of the first pillar moves towards the second surface of the second pillar and the bonding material deforms, and then solidifying the bonding material to provide the conductive bond that contacts and electrically connects the first and second pillars.

The method may include applying pressure until the first assembly contacts the second assembly and the first surface of the first pillar is essentially coplanar with the first surface of the second chip. The method may also include forming an encapsulant on the assemblies after solidifying the bonding material.

An advantage of the three-dimensional package of the present invention is that it is reliable, cost-effective, easily manufacturable, contains ultra-thin level-one chip assemblies in an integrated module, and can be directly mounted on a printed circuit board. Another advantage is that the pillars provide effective heat dissipation channels as well as vertical electrical interconnects. Another advantage is that the package can accommodate chips with varying sizes and thickness while maintaining reliable pillar connections. Another advantage is that the package is well-suited for severe operational conditions due to low stress at the pillar connections and short signal paths between the chips. Another advantage is that the package is well-suited for testing, disassembly and reworking. Another advantage is that the package can be manufactured using low temperature processes which reduces stress and improves reliability. A further advantage is that the package can be manufactured using well-controlled processes which can be easily implemented by circuit board, lead frame and tape manufacturers.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

FIGS. 1A–1F, 2A–2F and 3A–3F are cross-sectional, top and bottom views, respectively, of a method of making a three-dimensional stacked semiconductor package in accordance with a first embodiment of the present invention. Package 100 includes semiconductor chip assemblies 102 and 104 and solder joints 106 as discussed below.

Figure 1A:
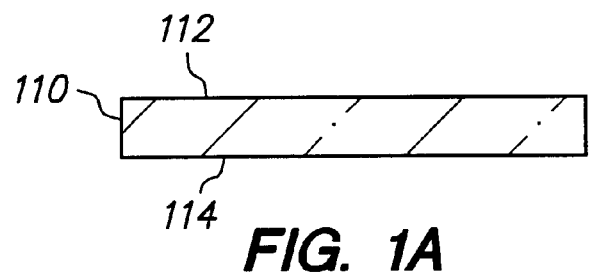
FIGS. 1A–1F are cross-sectional views showing a method of making a three-dimensional stacked semiconductor package in accordance with a first embodiment of the present invention.
Figure 2A:
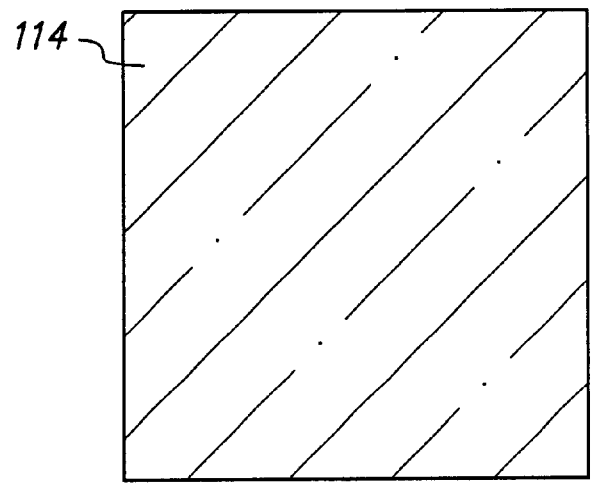
FIGS. 2A–2F are top plan views corresponding to FIGS. 1A–1F, respectively.
Figure 3A:
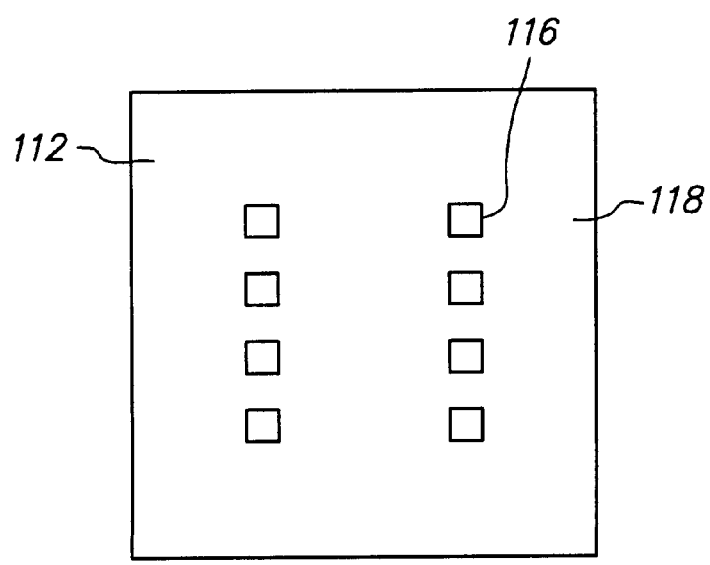
FIGS. 3A–3F are bottom plan views corresponding to FIGS. 1A–1F, respectively.

FIGS. 1A, 2A and 3A are cross-sectional, top and bottom views, respectively, of semiconductor chip 110 which is an integrated circuit in which various transistors, circuits, interconnect lines and the like are formed (not shown). For convenience of illustration, chip 110 is inverted (or flipped) such that its upper surface faces downward. Chip 110 includes first surface 112 and second surface 114 which are opposite one another. First surface 112 (normally designated the upper surface regardless of orientation) includes conductive pads 116, including pads 116A and 116B, and passivation layer 118. Pads 116 are substantially aligned with passivation layer 118 so that first surface 112 is essentially flat. Alternatively, if desired, pads 116 can extend above or be recessed below passivation layer 118. Pads 116 provide bonding sites to electrically couple chip 110 with external circuitry. Thus, pads 116 include input/output pads and power/ground pads. Pads 116 can have an aluminum base that serves as a surface layer, or alternatively, an aluminum base covered by a surface layer such as gold with an adhesion and/or barrier layer therebetween, depending on the nature of connection joints that shall subsequently contact them. If desired, the aluminum bases of pads 116 are cleaned by dipping chip 110 in a solution containing 0.05 M phosphoric acid at room temperature for 1 minute and then rinsed in distilled water before depositing the next layer on the aluminum bases.

Chip 110 has a length and width (along surfaces 112 and 114) of 10 millimeters and a thickness (between surfaces 112 and 114) of 200 microns. Pads 116 each have a length and width of 70 microns, and the pad pitch (or center-to-center spacing) is 200 microns. For convenience of illustration, only eight pads are shown although most chips contain more pads. Chip 110 has been singulated from other chips it was batch manufactured with on a wafer.

Figure 1B:
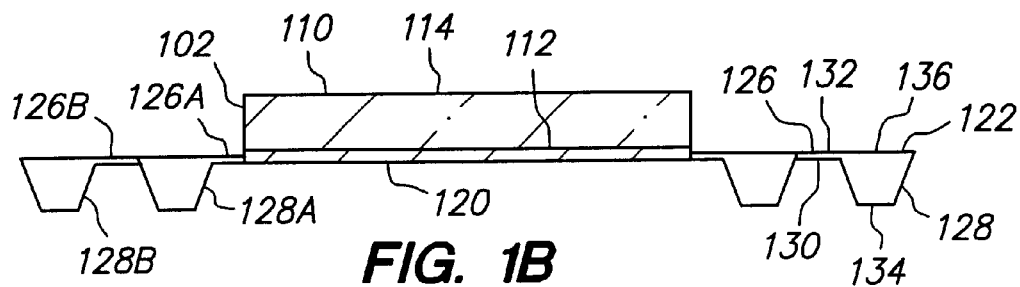
Figure 2B:
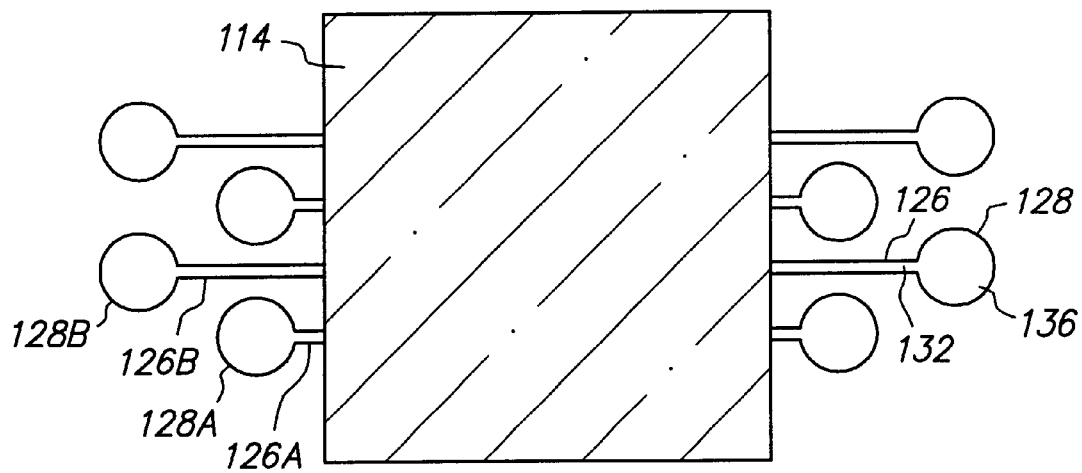
Figure 3B:
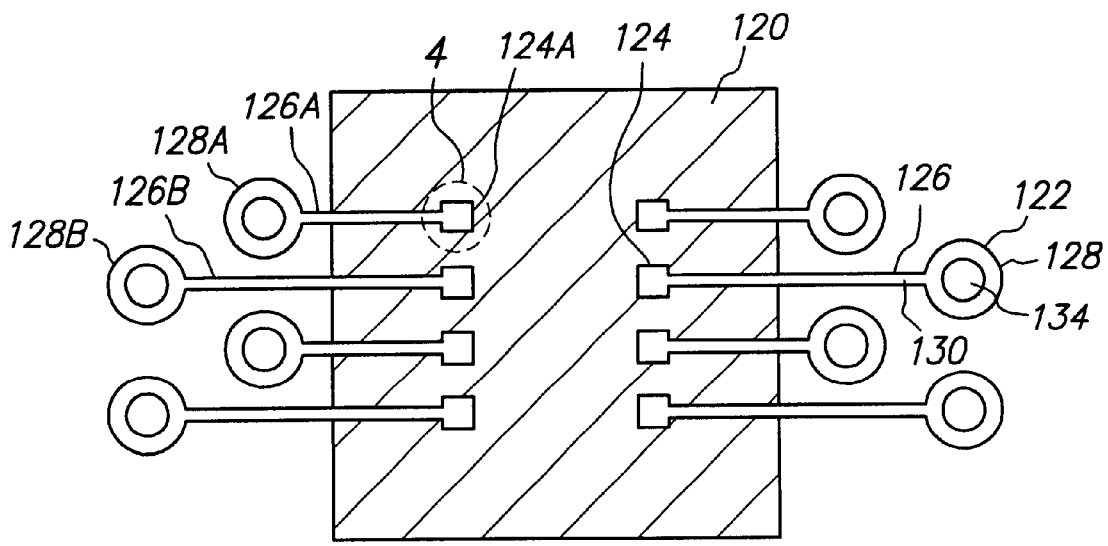

FIGS. 1B, 2B and 3B are cross-sectional, top and bottom views, respectively, of semiconductor chip assembly 102 which includes chip 110, insulative adhesive 120, conductive traces 122 and connection joints 124. Conductive traces 122 include routing lines 126 and pillars 128. Routing lines 126 include first surfaces 130 and second surfaces 132 that are opposite one another, and pillars 128 include first surfaces 134 and second surfaces 136 that are opposite one another. First surfaces 130 and 134 face away from first surface 112, and second surfaces 132 and 136 face towards first surface 112.

Assembly 102 is an ultra-thin level-one scale package in which second surface 114 of chip 110 is fully exposed. Conductive traces 122 are mechanically attached to chip 110 by adhesive 120 and electrically connected to chip 110 by connection joints 124. Each routing line 126 is aligned with and overlaps a corresponding pad 116, and each connection joint 124 is an electroplated metal that contacts and electrically connects a corresponding pad 116 and routing line 126.

Figure 4:
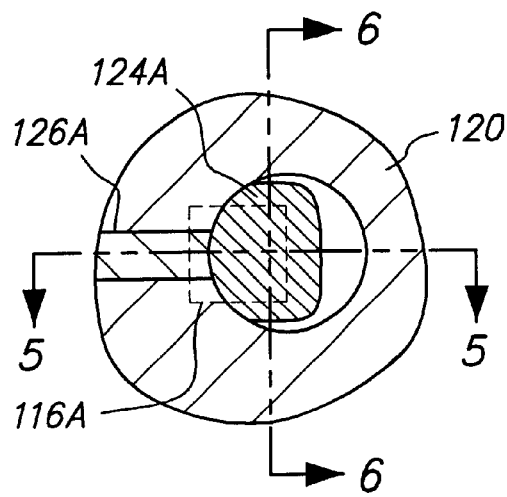
FIG. 4 is an enlarged plan view of encircled detail 4 in FIG. 3B.
Figure 5:
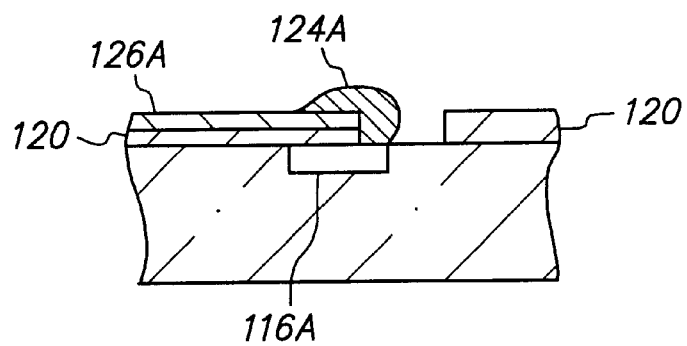
FIGS. 5 and 6 are enlarged cross-sectional views taken along lines 5—5 and 6—6, respectively, in FIG. 4.
Figure 6:
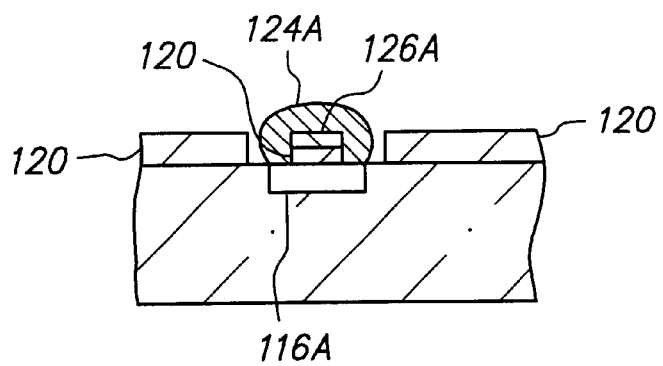

FIG. 4 is an enlarged plan view of encircled detail 4 in FIG. 3B, and FIGS. 5 and 6 are enlarged cross-sectional views taken across lines 5—5 and 6—6, respectively, in FIG. 4, that depict pad 116A, connection joint 124A and routing line 126A in greater detail. Pad 116A is shown in phantom in FIG. 4. As is seen, connection joint 124A is formed in a hole in adhesive 120 that extends to pad 116A, and routing line 126A overlaps pad 116A. Adhesive 120 contacts and is sandwiched between pad 116A and routing line 126A. Connection joint 124A contacts and electrically connects pad 116A and routing line 126A, thereby providing a robust, permanent electrical connection between pad 116A and routing line 126A. Connection joint 124A is the only electrical conductor external to chip 110 that contacts pad 116A, adhesive 120 and connection joint 124A are the only materials external to chip 110 that contact pad 116A, and adhesive 120 and connection joint 124A are the only materials that contact both pad 116A and routing line 126A. For purposes of the enlarged views, pad 116A, connection joint 124A and routing line 126A are representative of the other pads 116, connection joints 124 and routing lines 126 in assembly 102.

Returning to FIGS. 1B, 2B and 3B, conductive traces 122 are each single continuous metal leads devoid of wire bonds and TAB leads. Conductive traces 122 are essentially identical to one another except that routing lines 126 have alternating lengths so that pillars 128 are disposed in a staggered arrangement. The shorter routing lines 126 (such as routing line 126A) extend 75 microns beyond the periphery of chip 110 and are essentially identical to one another, and the longer routing lines (such as routing line 126B) extend 650 microns beyond the periphery of chip 110 and are essentially identical to one another. Conductive traces 122 are electrically isolated from one another.

Adhesive 120 contacts the sidewalls of routing lines 126 and is coplanar with first surfaces 130 of routing lines 126. Adhesive 120 has a thickness of 5 microns between first surface 112 of chip 110 and second surfaces 132 of routing lines 126, and a thickness of 10 microns outside routing lines 126.

Routing lines 126 are essentially flat, extend within the periphery of chip 110 to pads 116, and extend outside the periphery of chip 110 to pillars 128. In addition, routing lines 126 are parallel to and essentially coplanar with first surface 112 of chip 110. Routing lines 126 have a width of 40 microns and a thickness of 5 microns. Second surfaces 132 of routing lines 126 are separated from first surface 112 of chip 110 by 5 microns of adhesive 120.

Pillars 128 are located at distal ends of routing lines 126 outside the periphery of chip 110 and are contiguous with routing lines 126. Second surfaces 136 of pillars 128 are coplanar with second surfaces 132 of routing lines 126. Thus, second surfaces 136 of pillars 128 are parallel to and essentially coplanar with first surface 112 of chip 110. However, pillars 128 extend orthogonally from routing lines 126 in the direction away from chip 110. First surfaces 134 of pillars 128 extend about 175 microns beyond first surfaces 130 of routing lines 126, and about 185 microns beyond first surface 112 of chip 110. Pillars 128 have diameters of 150 microns at first surfaces 134, diameters of 300 microns at second surfaces 136, and sloped sidewalls between surfaces 134 and 136. Thus, pillars 128 have conical shapes in which the diameters increase from first surfaces 134 to second surfaces 136. In addition, first surfaces 134 are concentrically and symmetrically disposed within the surfaces areas of second surfaces 136. In other words, first surfaces 134 are positioned within 150 micron inner diameter portions of the surface areas of second surfaces 136, and first surfaces 134 are surrounded by 75 micron ((300–150)/2) wide outer annular portions of the surface areas of second surfaces 136. Pillars 128 are disposed in a staggered arrangement at alternating distances from chip 110 in order to increase packing density. For instance, pillar 128A (contiguous with shorter routing line 126A) is located 75 microns beyond the periphery of chip 110, and pillar 128B (contiguous with longer routing line 126B) is located 650 microns beyond the periphery of chip 110.

Routing lines 126 provide horizontal fan-out routing between pads 116 and pillars 128, and pillars 128 provides vertical routing away from chip 110. Stated differently, the combination of conductive traces 122 and connection joints 124 provides horizontal and vertical routing between pads 116 and external circuitry.

Adhesive 120 is a thermoplastic polyimide film with a glass transition temperature (Tg) of 400° C. Conductive traces 122 are copper, and connection joints 124 include a 1 micron nickel layer (that contacts pads 116 and conductive traces 122) covered by a 5 micron copper layer covered by a 0.3 micron gold layer.

Figure 1C:
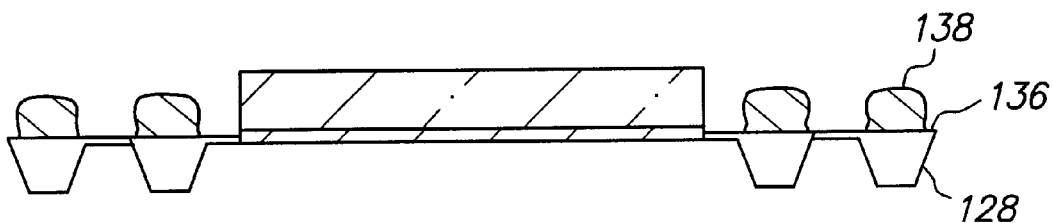
Figure 2C:
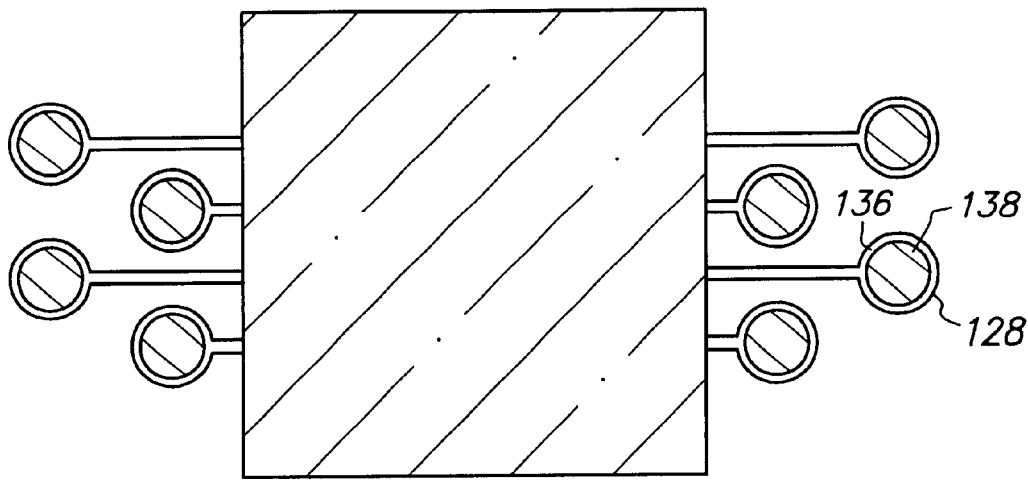
Figure 3C:
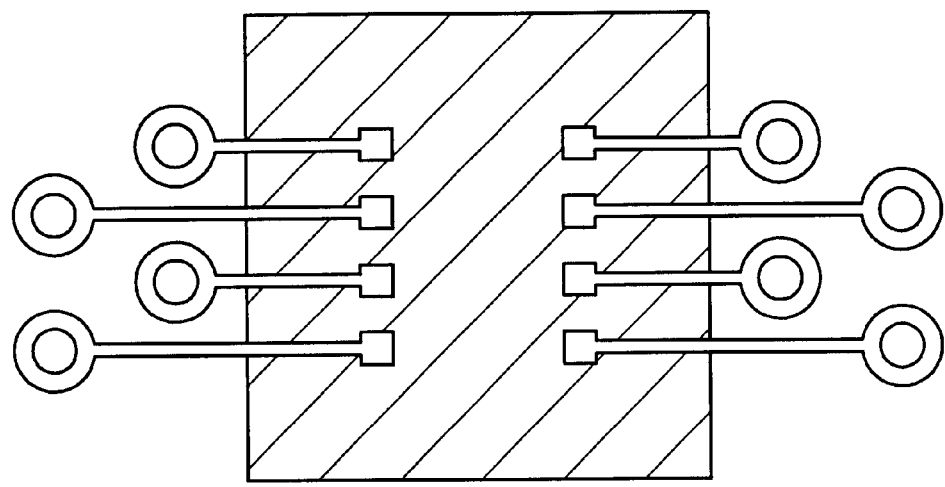

FIGS. 1C, 2C and 3C are cross-sectional, top and bottom views, respectively, of solder paste portions 138 deposited on assembly 102. Solder paste portions 138 are deposited on corresponding second surfaces 136 of pillars 128 using screen printing. During the screen printing process, solder paste is carried in front of a push bar called a squeegee and pushed through mask openings aligned with second surfaces 136 of pillars 128. Solder paste portions 138 include finely powdered tin-lead solder particles mixed in a viscous organic resin containing a fluxing agent. Solder paste portions 138 cover most of and are entirely disposed within the surface area of second surfaces 136 of pillars 128, and have a thickness of 150 microns.

Figure 1D:
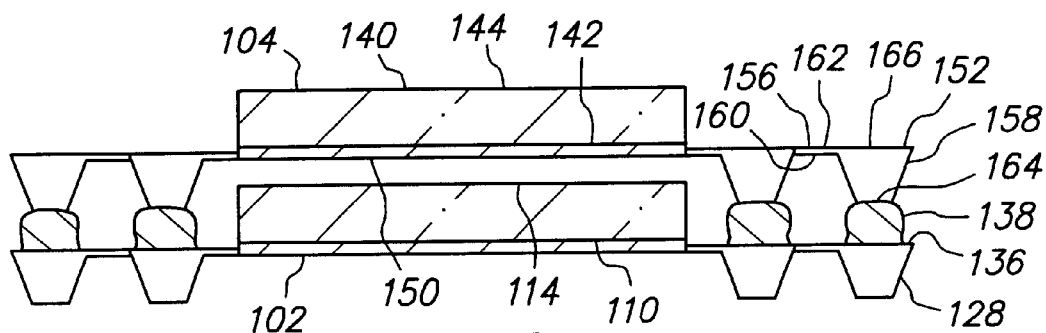
Figure 2D:
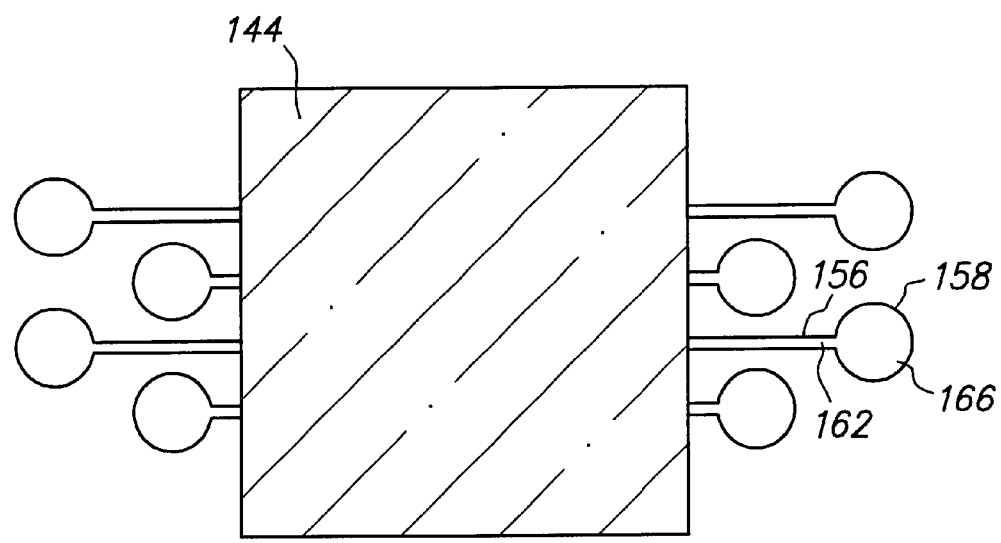
Figure 3D:
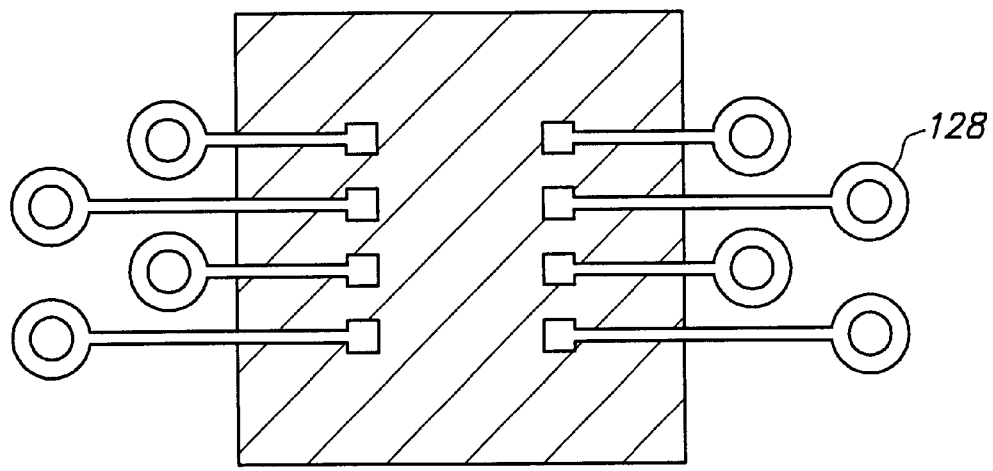

FIGS. 1D, 2D and 3D are cross-sectional, top and bottom views, respectively, of semiconductor chip assembly 104 positioned relative to semiconductor chip assembly 102. Assembly 104 includes chip 140, insulative adhesive 150, conductive traces 152 and connection joints (not shown). Chip 140 includes first surface 142 and second surface 144 that are opposite one another. First surface 142 includes pads (not shown) and a passivation layer (not shown). Conductive traces 152 include routing lines 156 and pillars 158. Routing lines 156 include first surfaces 160 and second surfaces 162 that are opposite one another, and pillars 158 include first surfaces 164 and second surfaces 166 that are opposite one another. First surfaces 160 and 164 face away from first surface 142, and second surfaces 162 and 166 face towards first surface 142. Assembly 104 is essentially identical to assembly 102, and therefore the description of assembly 102 is applicable to assembly 104 and need not be repeated.

Assemblies 102 and 104 are positioned relative to one another using a surface mount placement machine such that chips 110 and 140 are aligned with one another and pillars 128 and 158 are aligned with one another in a vertically stacked arrangement. In particular, first surface 142 of chip 140 faces second surface 114 of chip 110, and first surfaces 164 of pillars 158 face second surfaces 136 of pillars 128. In addition, pillars 158 are brought in contact with corresponding solder paste portions 138 on pillars 128. Solder paste portions 138, at room temperature, are compliant enough to conform to virtually any shape, yet tacky enough to adhere to the surfaces of pillars 128 and 158.

First surfaces 164 of pillars 158 are concentrically and symmetrically disposed within the surfaces areas of second surfaces 136 of pillars 128. Chip surfaces 114 and 142 are separated from one another by about 130 microns, and pillar surfaces 136 and 164 are separated from one another by about 150 microns.

Figure 1E:
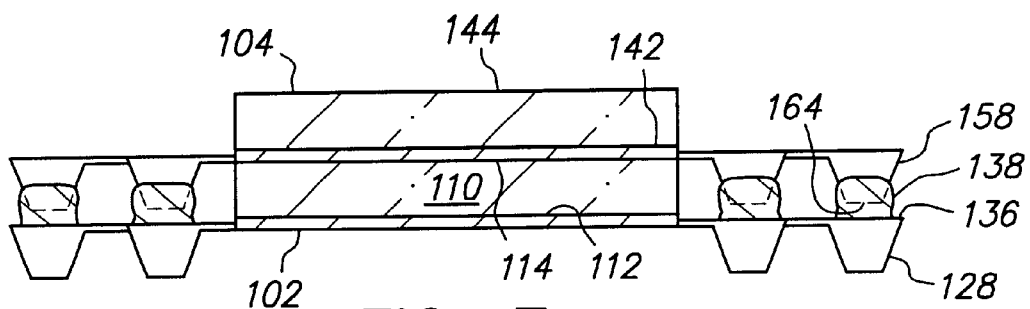
Figure 2E:
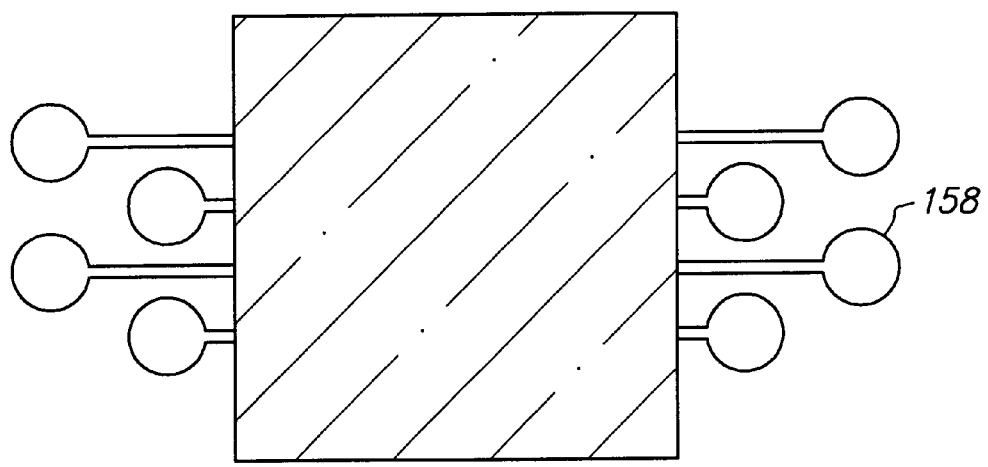
Figure 3E:
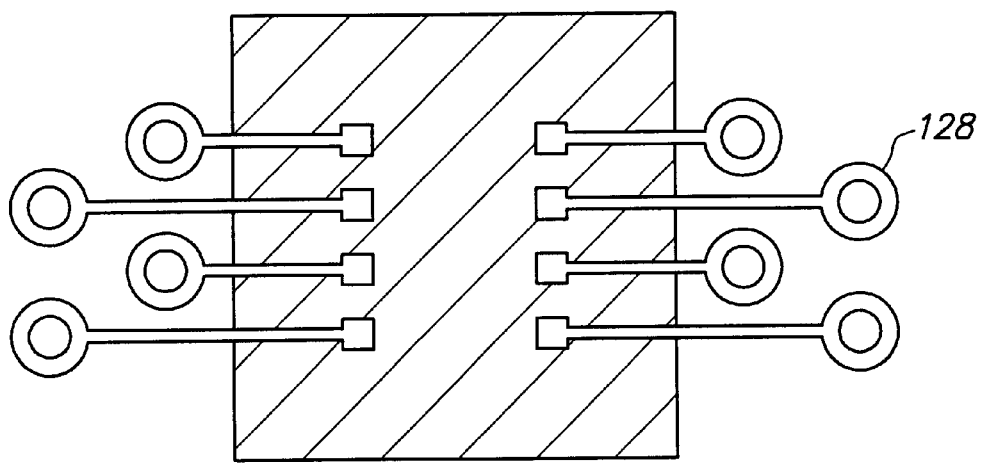

FIGS. 1E, 2E and 3E are cross-sectional, top and bottom views, respectively, of assemblies 102 and 104 moved towards one another by applying low pressure in the direction orthogonal to chip surfaces 112, 114, 142 and 144 using a platen. Since solder paste portions 138 are viscous, applying the pressure moves assemblies 102 and 104 towards one another and solder paste portions deform and are squeezed outside the narrowing gaps between pillars 128 and 158. As the pressure is applied, first surfaces 164 of pillars 158 (shown in phantom) tunnel into solder paste portions 138 until routing lines 156 contact second surface 114 of chip 110, at which time the movement stops and first surfaces 164 of pillars 158 and second surfaces 136 of pillars 128 are separated by 30 micron gaps filled with solder paste portions 138. Thereafter, the pressure is removed. Solder paste portions 138 are sufficiently viscous to provide a weak adherent bond between assemblies 102 and 104.

It should be noted that the thickness of the gaps between pillars 128 and 158 may vary (e.g., between 20 microns and 40 microns) if the thickness of chip 110 falls within a range (e.g., 190 microns to 210 microns) due to wafer processing variations. Advantageously, the compliant and deformable nature of solder paste portions 138 provides for flexible vertical interconnections that can accommodate chip 110 with a wide range of thicknesses. That is, the process provides an essentially identical package despite chip thickness variations and need not be adjusted or customized (e.g., trimming the pillar heights) to accommodate chip thickness variations. As a result, the process is well-suited for cost-effective volume production.

Figure 1F:
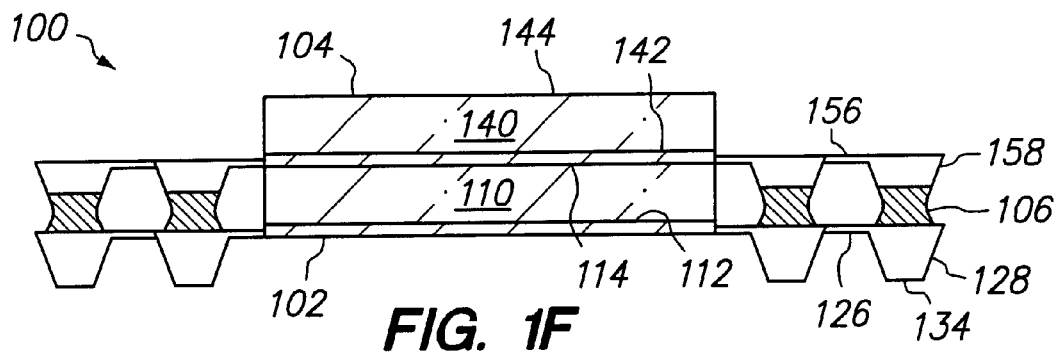
Figure 2F:
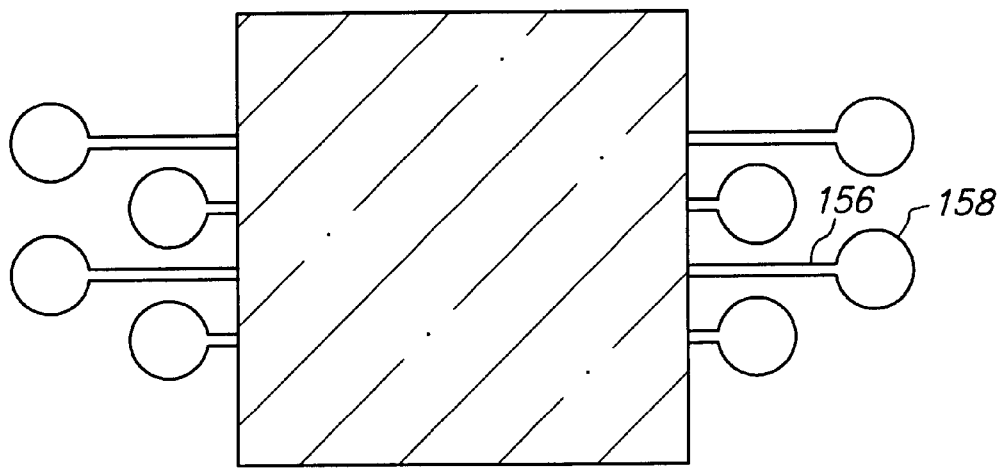
Figure 3F:
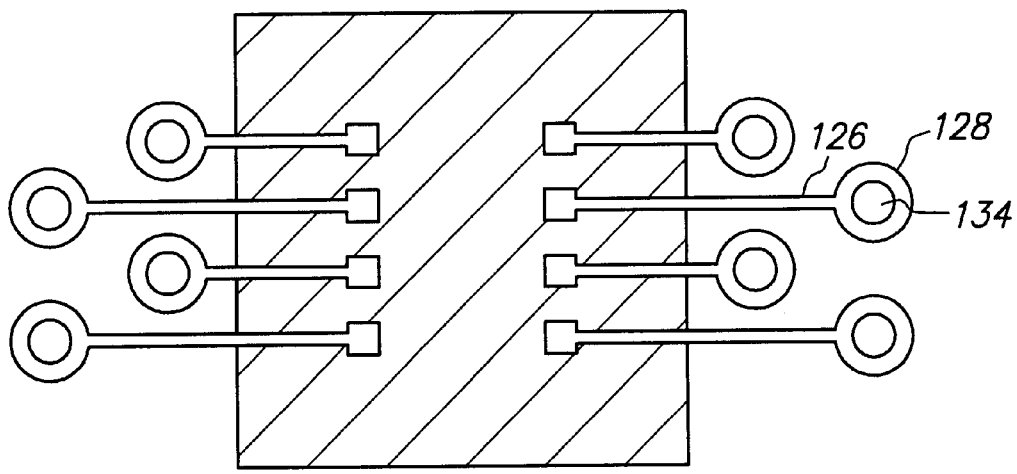

FIGS. 1F, 2F and 3F are cross-sectional, top and bottom views, respectively, of assemblies 102 and 104 mechanically and electrically bonded to one another by solder joints 106. This is achieved by heating solder paste portions 138 to a temperature of about 210° C. The heat causes the flux in solder paste portions 138 to react with and remove oxides from pillars 128 and 158 and the solder particles in solder paste portions 138, renders the solder particles molten such that they coalesce and wet pillars 128 and 158, and vaporizes the organic resin in solder paste portions 138. The heat can be supplied by a convection oven, although other heating techniques such as infrared (IR) continuous belt reflow, hot nitrogen gas or a laser beam can be used. As the heat is applied and the molten solder particles reflow, routing lines 156 continue to contact second surface 114 of chip 110 and there is no appreciable movement between assemblies 102 and 104. Thereafter, the heat is removed and the molten solder particles cool and solidify into hardened solder joints 106 that are sandwiched between and mechanically and electrically connect pillars 128 and 158.

Solder paste portions 138 have a mass that falls within a narrow tolerance such that there is enough solder to wet the corresponding pillars 128 and 158 during the reflow operation and form solder joints 106 with sufficiently large contact areas to provide robust mechanical and electrical connections between pillars 128 and pillars 158 without providing so much solder as to create bridges or electrical shorts between horizontally adjacent pillars 128 and 158.

At this stage, three-dimensional package 100 which includes assemblies 102 and 104 and solder joints 106 can be considered complete. First surfaces 164 of pillars 158 (not shown in FIG. 1F) are essentially coplanar with but are slightly displaced from and do not extend to first surface 112 of chip 110, are concentrically and symmetrically disposed within the surfaces areas of second surfaces 136 of pillars 128, are separated from second surfaces 136 of pillars 128 by the 30 micron thickness of solder joints 106, and are embedded within solder joints 106. Second surfaces 132 of routing lines 126 and second surfaces 136 of pillars 128 are essentially coplanar with but are slightly displaced from and do not extend to first surface 112 of chip 110, and second surfaces 162 of routing lines 156 and second surfaces 166 of pillars 158 are essentially coplanar with but are slightly displaced from and do not extend to first surface 142 of chip 140. Thus, pillars 158 are essentially coplanar with first surface 112 and chip 110 and first surface 142 of chip 140. Likewise, second surfaces 132 of routing lines 126 and second surfaces 136 of pillars 128 are not essentially coplanar with second surface 114 of chip 110, and second surfaces 162 of routing lines 156 and second surfaces 166 of pillars 158 are not essentially coplanar with second surface 144 of chip 140.

Solder joints 106, conductive traces 122 and 152, and the connection joints provide electrically conductive paths between corresponding pads on chips 110 and 140. Pillars 128 and 158 provide heat dissipation channels for chips 110 and 140. Solder joints 106 mechanically and electrically connect pillars 128 and 158, and provide the sole mechanical and electrical attachment between assemblies 102 and 104. Furthermore, first surfaces 134 of pillars 128 remain exposed and provide contact terminals for matching bond sites on the next level assembly such as a printed circuit board.

Figure 7:
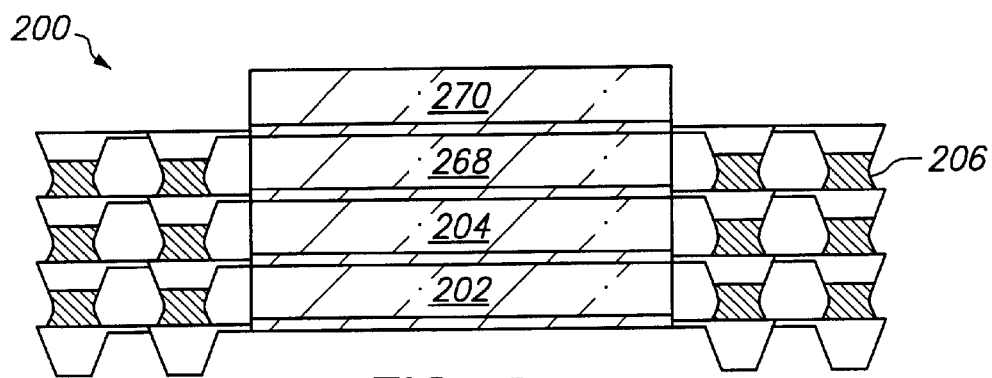
FIG. 7 is a cross-sectional view of a three-dimensional stacked semiconductor package in accordance with a second embodiment of the present invention in which additional assemblies are stacked.
Figure 8:
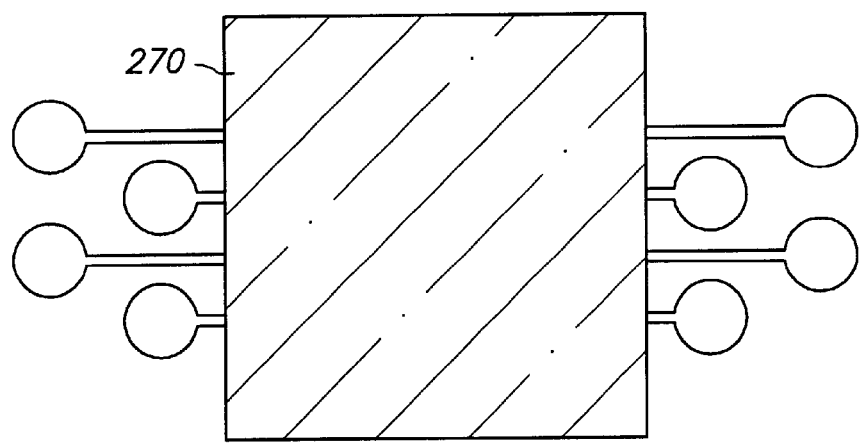
FIG. 8 is a top plan view corresponding to FIG. 7.
Figure 9:
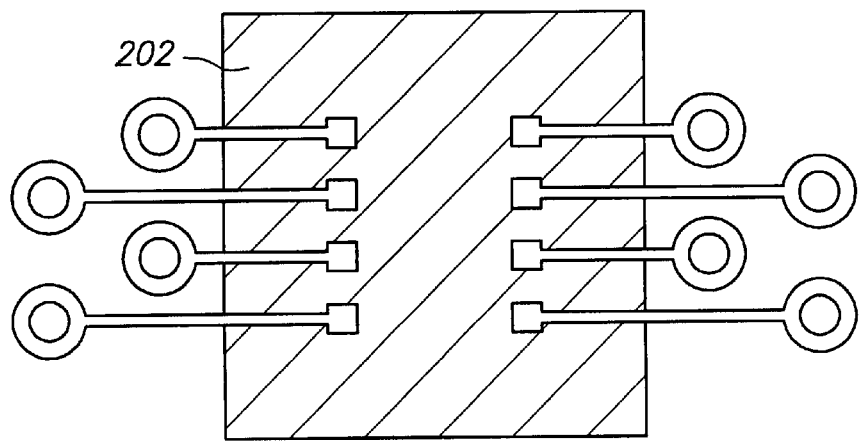
FIG. 9 is a bottom plan view corresponding to FIG. 7.

FIGS. 7, 8 and 9 are cross-sectional, top and bottom views, respectively of a three-dimensional stacked semiconductor package in accordance with a second embodiment of the present invention in which additional assemblies are stacked. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, assembly 202 corresponds to assembly 102, assembly 204 corresponds to assembly 104, etc.

Package 200 includes assemblies 202, 204, 268 and 270 connected by solder joints 206. Assemblies 202, 204, 268 and 270 are identical to assembly 102. Package 200 can be manufactured in various sequences. For instance, assembly 204 can be bonded to assembly 202, then assembly 268 can be bonded to assembly 204, then assembly 270 can be bonded to assembly 268. Alternatively, assemblies 202, 204, 268 and 270 can be stacked and then simultaneously bonded together during a single reflow operation. As another alternative, assemblies 202 and 204 can be stacked and bonded together, then assemblies 268 and 270 can be stacked and bonded together, and then assemblies 204 and 268 can be stacked and bonded together.

Figure 10:
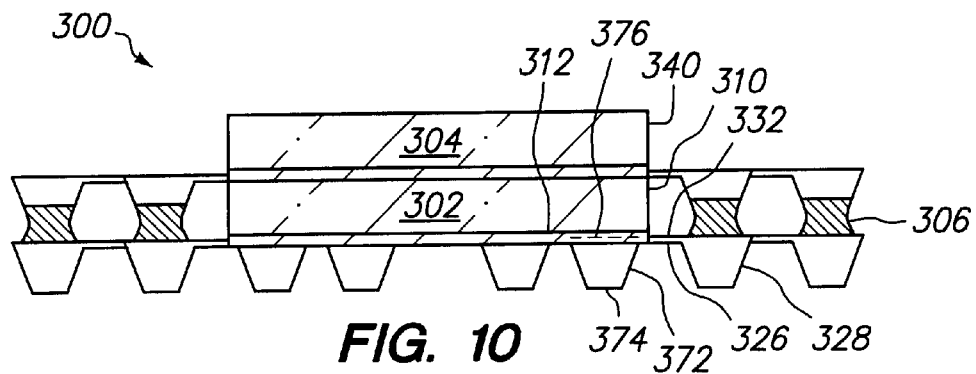
FIG. 10 is a cross-sectional view of a three-dimensional stacked semiconductor package in accordance with a third embodiment of the present invention in which the lowest assembly in the package contains additional pillars within the periphery of the chip.
Figure 11:
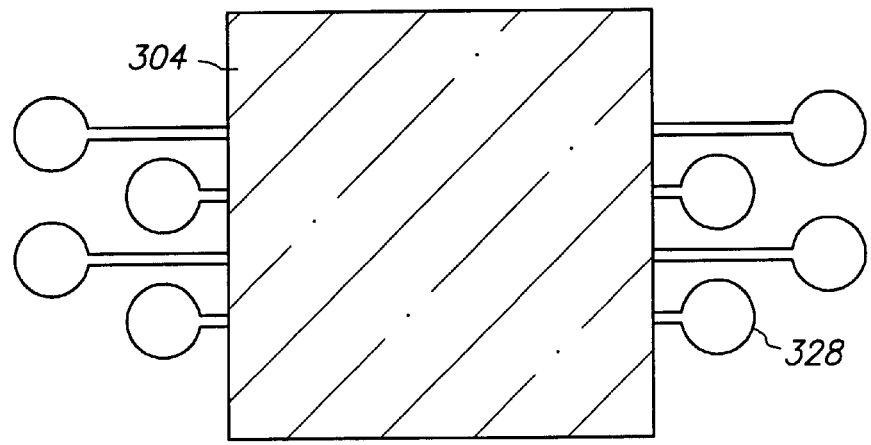
FIG. 11 is a top plan view corresponding to FIG. 10.
Figure 12:
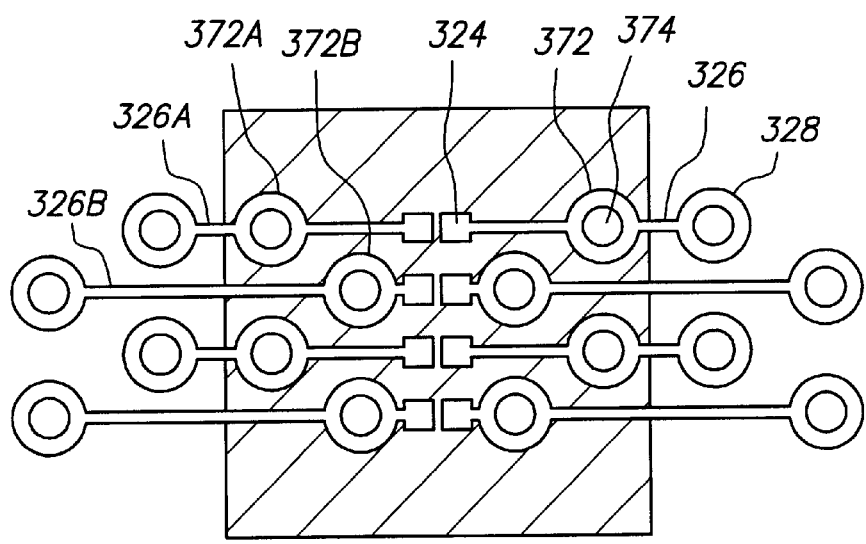
FIG. 12 is a bottom plan view corresponding to FIG. 10.

FIGS. 10, 11 and 12 are cross-sectional, top and bottom views, respectively of a three-dimensional stacked semiconductor package in accordance with a third embodiment of the present invention in which the lowest assembly in the package contains additional pillars within the periphery of the chip. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, assembly 302 corresponds to assembly 102, assembly 304 corresponds to assembly 104, etc.

Package 300 includes assemblies 302 and 304 connected by solder joints 306. Package 300 is identical to package 100 except that conductive traces 322 on assembly 302 further include pillars 372. (For convenience of illustration, connection joints 324 and the corresponding chip pads are located closer to the center of chip 310). Pillars 372 are located between distal ends of routing lines 326 inside the periphery of chip 310 and are contiguous with routing lines 326. Pillars 372 include first surfaces 374 and second surfaces 376 (shown in phantom in FIG. 10) that are opposite one another. First surfaces 374 face away from surface 312 of chip 310, and second surfaces 376 face towards first surface: 312 of chip 310. Second surfaces 376 of pillars 372 are coplanar with second surfaces 332 of routing lines 326. Thus, second surfaces 376 of pillars 372 are parallel to and essentially coplanar with first surface 312 of chip 310. However, pillars 372 extend orthogonally from routing lines 326 in the direction away from chip 310. First surfaces 374 of pillars 372 are located about 175 microns beyond routing lines 326. Pillars 372 have identical shapes and sizes as those of pillars 328. In addition, pillars 372 are disposed in a staggered arrangement at alternating distances from the periphery of chip 310 in order to increase packing density. For instance, pillar 372A (contiguous with shorter routing line 326A) is located 75 microns within the periphery of chip 310, and pillar 372B (contiguous with longer routing line 326B) is located 650 microns within the periphery of chip 310.

Advantageously, pillars 372 provide enhanced mechanical and electrical coupling to a printed circuit board (not shown) upon which package 300 can be mounted during the next level assembly. Such a printed circuit board can include solder-coated bonding sites aligned with pillars 328 and pillars 372 of assembly 302. As a result, pillars 372 effectively double the mechanical and electrical contact area between package 300 and the printed circuit board, thereby reducing mechanical stress and improving reliability. Moreover, since pillars 372 are only included in assembly 302, the lowest assembly in package 300, pillars 372 do not adversely affect the packing density of package 300. That is, if pillars 372 were included in assembly 304, then either the vertical separation between chips 310 and 340 would need to be significantly increased, or chip 310 would need via holes to accommodate pillars 372, neither of which is a desirable arrangement.

Figure 13:
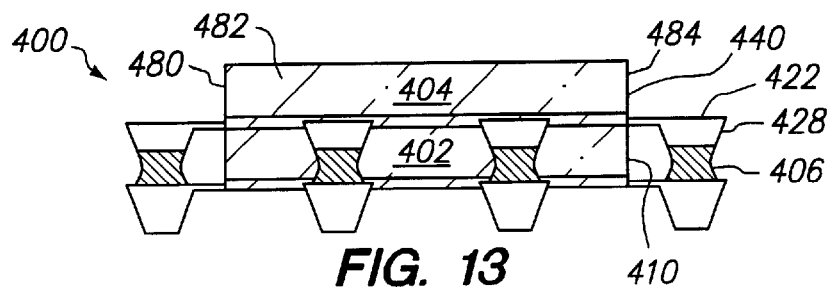
FIG. 13 is a cross-sectional view of a three-dimensional stacked semiconductor package in accordance with a fourth embodiment of the present invention in which the conductive traces extend across four peripheral edges of the chips.
Figure 14:
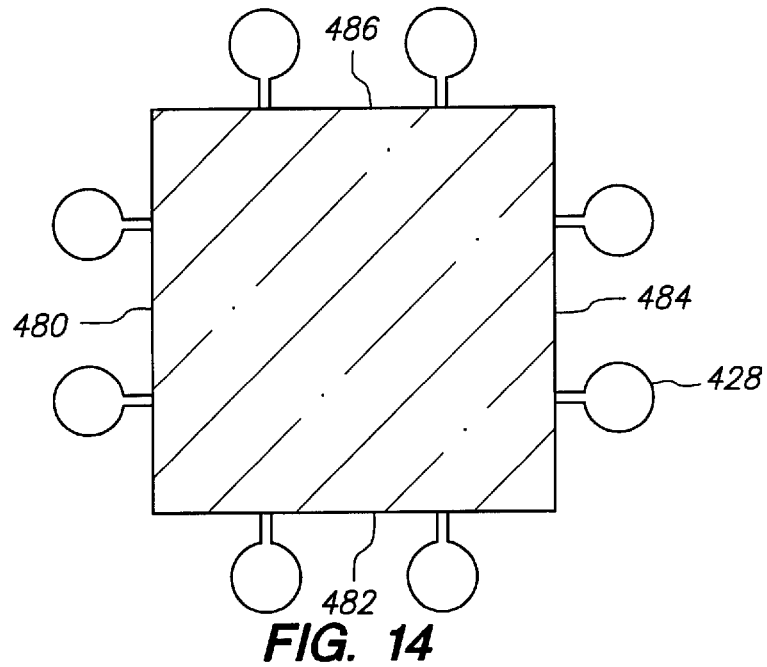
FIG. 14 is a top plan view corresponding to FIG. 13.
Figure 15:
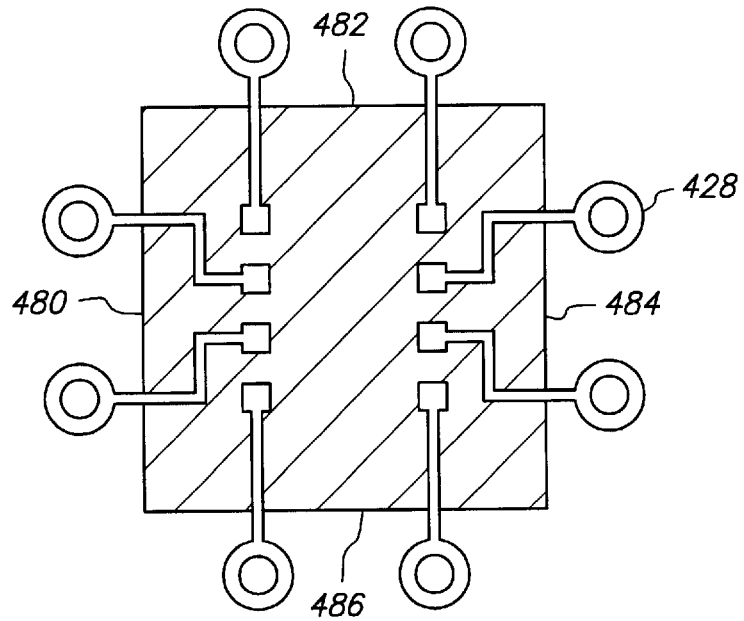
FIG. 15 is a bottom plan view corresponding to FIG. 13.

FIGS. 13, 14 and 15 are cross-sectional, top and bottom views, respectively of a three-dimensional stacked semiconductor package in accordance with a fourth embodiment of the present invention in which the conductive traces extend across four peripheral edges of the chips. For purposes of brevity, any description in the first embodiment is incorporated herein insofar as the same is applicable, and the same description need not be repeated. Likewise, elements of the fourth embodiment similar to those in the first embodiment have corresponding reference numerals indexed at four-hundred rather than one-hundred. For instance, assembly 402 corresponds to assembly 102, assembly 404 corresponds to assembly 104, etc.

Package 400 includes assemblies 402 and 404 connected by solder joints 406. Package 400 is identical to package 100 except that conductive traces 422 extend across four peripheral edges of chips 410 and 440. That is, pillars 428 are disposed outside peripheral edges 480, 482, 484 and 486. Furthermore, since the number of pillars 428 outside peripheral edges 480 and 484 have been reduced (or shifted to outside peripheral edges 482 and 486), the pillar pitch can be increased, and pillars 428 no longer need be staggered. Instead, pillars 428 are each disposed 75 microns from the periphery of chips 410 and 440. As a result, package 400 requires less surface area than package 100 in the x-direction across peripheral edges 480 and 484, but package 400 requires more surface area than package 100 in the y-direction across peripheral edges 482 and 486.

Figure 16:
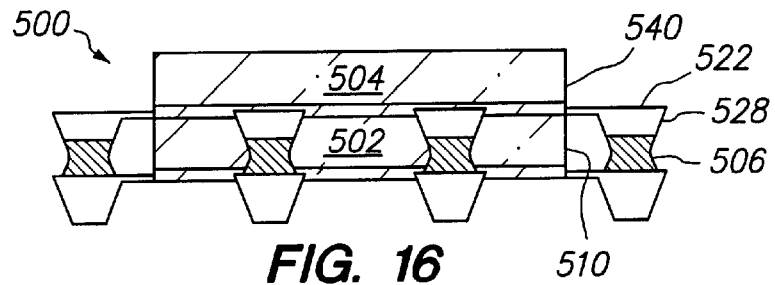
FIG. 16 is a cross-sectional view of a three-dimensional stacked semiconductor package in accordance with a fifth embodiment of the present invention in which the conductive traces on the lowest assembly provide horizontal routing in two dimensions.
Figure 17:
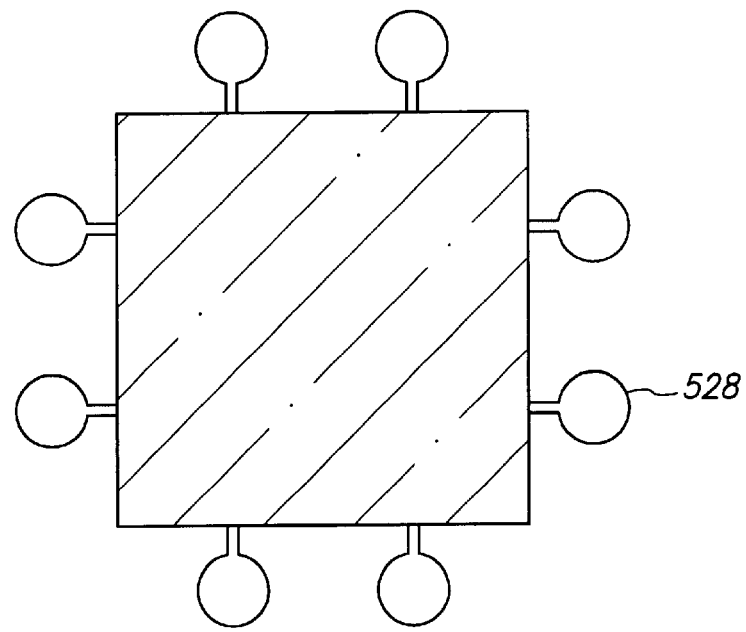
FIG. 17 is a top plan view corresponding to FIG. 16.
Figure 18:
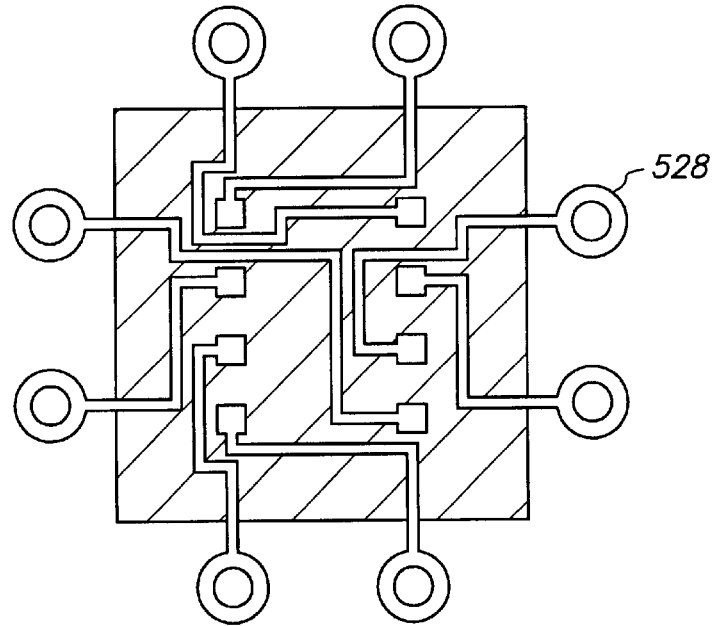
FIG. 18 is a bottom plan view corresponding to FIG. 16.

FIGS. 16, 17 and 18 are cross-sectional, top and bottom views, respectively of a three-dimensional stacked semiconductor package in accordance with a fifth embodiment of the present invention in which the conductive traces provide horizontal routing in two dimensions. For purposes of brevity, any description in the first embodiment is incorporated herein insofar as the same is applicable, and the same description need not be repeated. Likewise, elements of the fifth embodiment similar to those in the first embodiment have corresponding reference numerals indexed at five-hundred rather than one-hundred. For instance, assembly 502 corresponds to assembly 102, assembly 504 corresponds to assembly 104, etc.

Package 500 includes assemblies 502 and 504 connected by solder joints 506. Package 500 is identical to package 100 except in two respects. First, conductive traces 522 extend across four peripheral edges of chips 510 and 540 in a similar fashion to conductive traces 422 in package 400. Second, conductive traces 522 on assembly 502 provide two-dimensional horizontal routing. That is, conductive traces 522 on assembly 502 route the pads on chip 510 to different pillars 528 than would otherwise occur if one-dimensional peripheral-to-area translation were employed. On the other hand, conductive traces 522 on assembly 504 route the pads on chip 540 to the nearest pillars 528 using one-dimensional peripheral-to-area translation similar to that in assembly 402 (FIG. 15). As a result, package 500 provides customized interconnection between the pads on chips 510 and 540.

Figure 19:
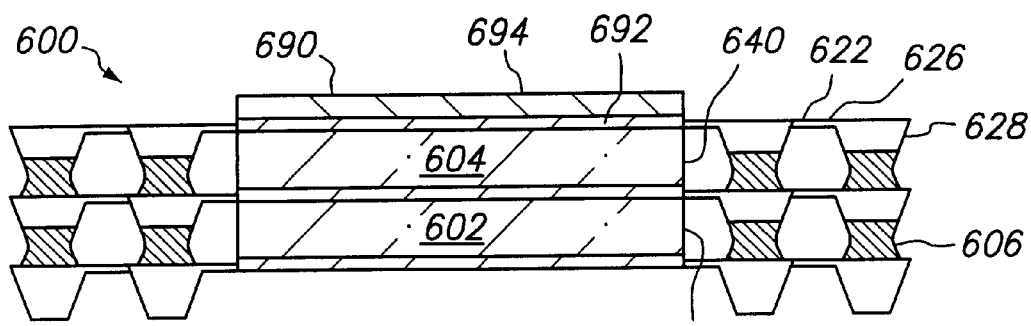
FIG. 19 is a cross-sectional view of a three-dimensional stacked semiconductor package in accordance with a sixth embodiment of the present invention in which a heat removal structure is disposed over the highest assembly to enhance thermal dissipation.
Figure 20:
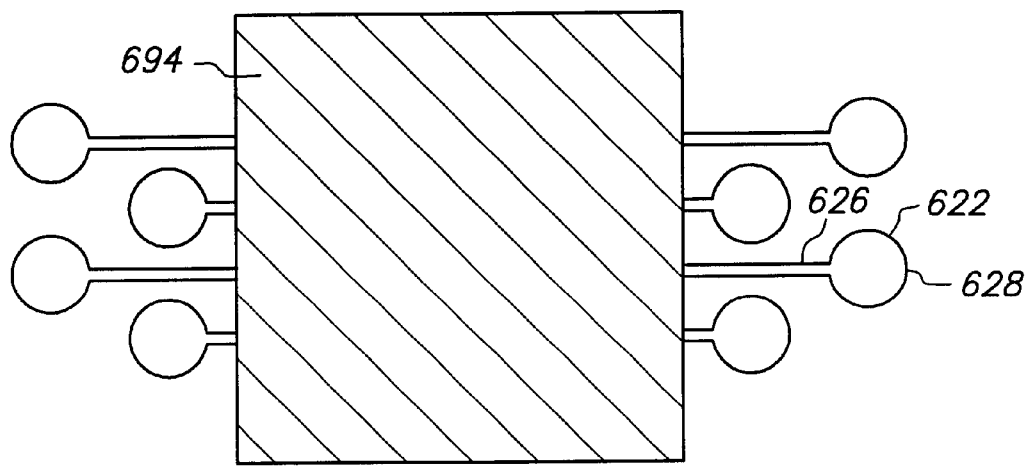
FIG. 20 is a top plan view corresponding to FIG. 19.
Figure 21:
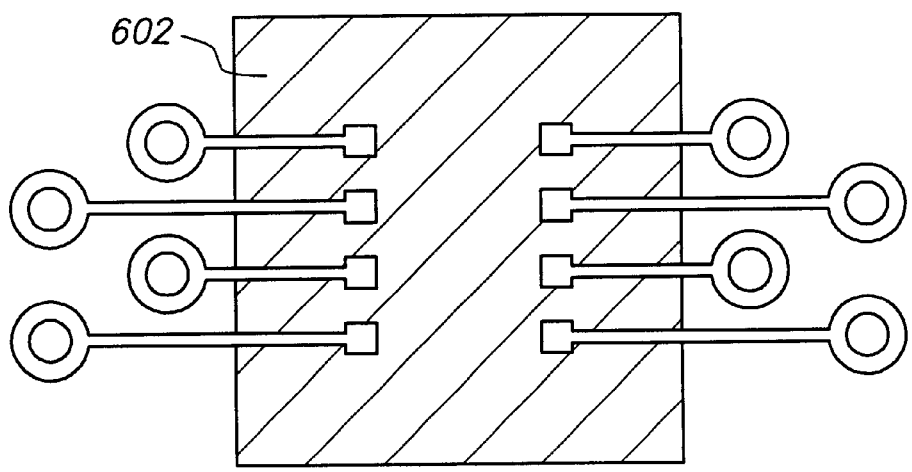
FIG. 21 is a bottom plan view corresponding to FIG. 19.

FIGS. 19, 20 and 21 are cross-sectional, top and bottom views, respectively of a three-dimensional stacked semiconductor package in accordance with a sixth embodiment of the present invention in which a heat removal structure is disposed over the highest assembly to enhance thermal dissipation. For purposes of brevity, any description in the first embodiment is incorporated herein insofar as the same is applicable, and the same description need not be repeated. Likewise, elements of the sixth embodiment similar to those in the first embodiment have corresponding reference numerals indexed at six-hundred rather than one-hundred. For instance, assembly 602 corresponds to assembly 102, assembly 604 corresponds to assembly 104, etc.

Package 600 includes assemblies 602 and 604 connected by solder joints 606. Package 600 is identical to package 100 except that package 600 further includes heat removal structure 690 disposed over assembly 604. Heat removal structure 690 includes conductive traces 622, adhesive 692 and coverplate 694. Conductive traces 622 include routing lines 626 that extend within and outside the periphery of coverplate 694 and pillars 628 located outside the periphery of coverplate 694 and aligned with the other pillars in the package. Adhesive 692 is a thermally conductive but electrically insulative material, such as a suitable epoxy, that is sandwiched between and mechanically connects routing lines 626 and coverplate 694, thereby thermally and mechanically coupling routing lines 626 to coverplate 694 without electrically connecting routing lines 626. Coverplate 694 is a copper plate that is aligned with and has the same surface area as chips 610 and 640. Coverplate 694 provides a large thermal dissipation surface area. Thus, heat removal structure 690 is thermally coupled to chips 610 and 640 through conductive traces 622 and enhances the thermal dissipation characteristics of package 600.

Figure 22:
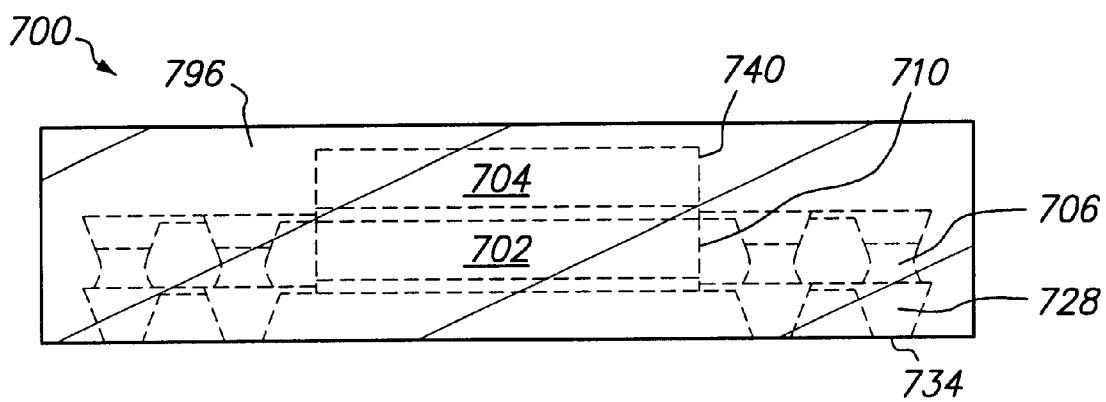
FIG. 22 is a cross-sectional view of a three-dimensional stacked semiconductor package in accordance with a seventh embodiment of the present invention in which an encapsulant is formed on the assemblies.
Figure 23:
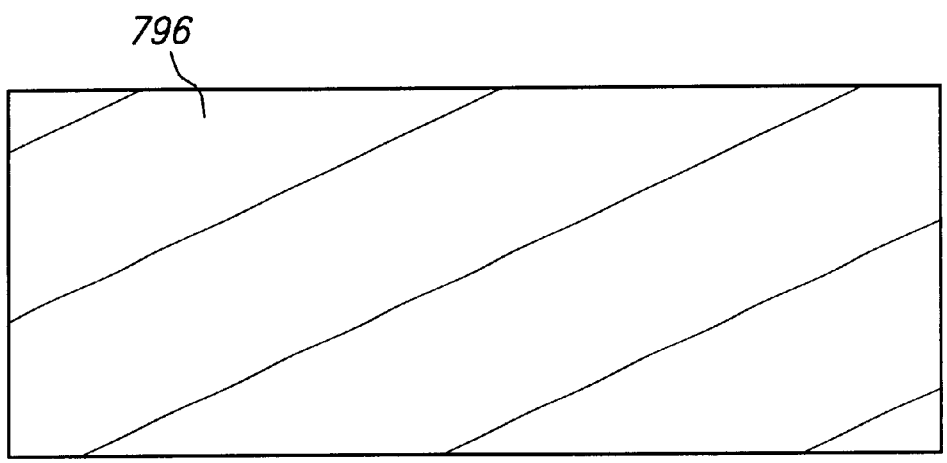
FIG. 23 is a top plan view corresponding to FIG. 22.
Figure 24:
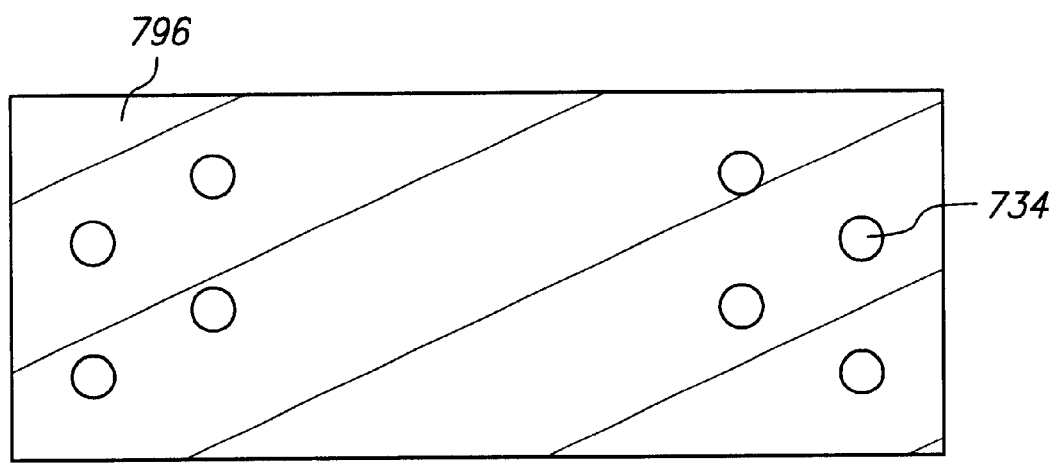
FIG. 24 is a bottom plan view corresponding to FIG. 22.

FIGS. 22, 23 and 24 are cross-sectional, top and bottom views, respectively of a three-dimensional stacked semiconductor package in accordance with a seventh embodiment of the present invention in which an encapsulant is formed on the assemblies. For purposes of brevity, any description in the first embodiment is incorporated herein insofar as the same is applicable, and the same description need not be repeated. Likewise, elements of the seventh embodiment similar to those in the first embodiment have corresponding reference numerals indexed at seven-hundred rather than one-hundred. For instance, assembly 702 corresponds to assembly 102, assembly 704 corresponds to assembly 104, etc.

Package 700 includes assemblies 702 and 704 connected by solder joints 706 (all shown in phantom in FIG. 22). Package 700 is identical to package 100 except that package 700 further includes encapsulant 796 formed on assemblies 702 and 704. Encapsulant 796 is formed by transfer molding after solder joints 706 are formed. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art. Encapsulant 796 contacts and covers the exposed surfaces of assemblies 702 and 704 and solder joints 706 except for first surfaces 734 of pillars 728 of assembly 702, and fills the remaining space in package 700. Encapsulant 796 extends 400 microns beyond the outer surfaces of assemblies 702 and 704 except for the lowest surface of assembly 702, where encapsulant 796 is aligned and coplanar with first surfaces 734 of pillars 728 of assembly 702. Encapsulant 796 is a solid adherent compliant protective layer that provides environmental protection such as moisture resistance and particle protection for chips 710 and 740 as well as protection from handling damage.

The three-dimensional packages described above are merely exemplary. Numerous other embodiments are contemplated. For instance, various aspects of the embodiments described above can be combined with one another. The package may contain two or more assemblies. The conductive traces may extend beyond one or more outer edges of the chips. Furthermore, the assemblies may contain passive components such as integrated capacitors and the like.

The package can include a wide variety of chips including microprocessors, field programmable gate arrays (FPGAs), logic drivers, and memories such as dynamic random access memories (DRAMs) and static random access memories (SRAMs). The chips can have identical functionality, such as stacked memory chips, or different functionality, such as a microprocessor and a memory chip. The chips need not have identical sizes. For instance, multiple memory chips may have identical surface areas but different thickness due to variations introduced by wafer processing, in which case the routing lines can slightly bend outside the peripheries of the chips and/or the conductive bonds between the pillars can provide suitably sized gaps between the pillars to accommodate these thickness variations. Furthermore, the chips may have different surface areas, as may be the case with a microprocessor and a memory chip, in which case the pillars would still be aligned with one another but the routing lines would have varying lengths to accommodate the varying horizontal distances between the pillars and the chip pads. In this instance, additional pillars (such as pillars 372) might be used within the periphery of the larger microprocessor chip if they are outside the periphery of the adjacent lower memory chip.

The conductive traces may function as signal, power or ground layers depending on the purpose of the associated chip pads.

The conductive traces can have various shapes and sizes. The conductive traces can overlap various portions of the pad, such as four peripheral edges but not the center of the pad, two opposing peripheral edges and the center of the pad, one peripheral edge and the center of the pad, three peripheral edges but not the center of the pad, or two corners and the center of the pad.

The conductive traces can be various conductive metals including copper, gold, nickel, aluminum, palladium, tin, combinations thereof, and alloys thereof. The preferred composition of the conductive traces will depend on the nature of the connection joints as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper).

The conductive traces can be a single layer or multiple layers. For instance, the conductive traces can be a single copper layer, or a 0.5 micron gold layer on a 5 micron nickel layer, or a 0.5 micron tin layer on a 0.5 micron gold layer on a 5 micron nickel layer. If desired, the conductive traces can be spot plated near the pads to make them compatible with receiving the connection joints. For instance, copper conductive traces can be spot plated with nickel and then silver to make them compatible with a gold ball bond connection joints and avoid the formation of brittle silver-copper intermetallic compounds.

The conductive traces can be formed and attached to the chips by a wide variety of lead-on-chip (LOC) and other connection techniques. See, for instance, U.S. application Ser. No. 09/878,649 filed Jun. 11, 2001 by Charles W. C. Lin entitled "Method of Making a Semiconductor Chip Assembly with a Conductive Trace Subtractively Formed Before and After Chip Attachment," and U.S. application Ser. No. 09/878,626 filed Jun. 11, 2001 by Charles W. C. Lin entitled "Method of Connecting a Conductive Trace to a Semiconductor Chip," each of which is incorporated by reference.

The pillars can be formed in numerous manners, including additive and subtractive techniques, and can have a wide variety of shapes including conical and cylindrical shapes. The routing lines can fan-in as well as fan-out from the chip pads. Furthermore, various routing lines may interconnect multiple pads on a single chip, or alternatively not be connected to any pads on a chip such that the corresponding pillars provide mechanical support, thermal dissipation and/or electrical interconnections for other assemblies. For instance, stacked memory chips can be arranged with like address and control pads connected together such that all chips are selected simultaneously and fed identical address values. Alternatively, stacked memory chips can be arranged such that only one chip is selected by a particular access. In this arrangement, the write enable pads and like address, data-in and data-out pads could be connected, and the RAS and CAS pads for each chip could be connected to dedicated RAS and CAS input lines (one pair per chip).

The connection joints between the conductive traces and the pads can be formed from a wide variety of materials including copper, gold, nickel, palladium, tin, alloys thereof, and combinations thereof, can be formed by a wide variety of processes including electroplating, electroless plating, ball bonding, solder reflowing and conductive adhesive curing, and can have a wide variety of shapes and sizes. The shape and composition of the connection joints depends on design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference.

The conductive bonds between the pillars can be formed from a wide variety of materials including solder, conductive adhesive, conductive paste, plated metal and welded joints, and introduced by a wide variety of processes including dispensing, printing, electroplating, electroless plating and laser welding. Reworkable conductive bonds such as solder joints or thermoplastic conductive adhesives are preferred. The conductive bonds can be formed from a bonding material deposited on one or both pillars before the pillars are aligned with one another, or deposited on both pillars after the pillars contact one another. Similarly, if the bonding material is disposed between the pillars and pressure is applied that moves the pillars towards one another while the bonding material is non-solidified, the pillars may contact one another or remain separated by the sandwiched bonding material that solidifies into the conductive bonds, depending, for instance, on the relative heights of the assemblies and the pillars. Moreover, the pressure need not necessarily be applied. For instance, a solder paste may have sufficiently low viscosity that the assemblies contact one another by gravitational force. Alternatively, the assemblies can be stacked such that the lower adjacent assemblies are contacted at the second surfaces of the pillars and/or the second surfaces of the chips, and then the conductive bonds can be formed by electroplating, electroless plating or welding.

The encapsulant can be formed with a wide variety of materials and processes. Suitable encapsulants include molded plastic and epoxies. Alternatively, the bonded assemblies can be enclosed in a metal housing.

The assemblies may include an insulative base that covers the routing lines and the connection joints to enhance mechanical strength. The insulative base may be rigid or flexible, and may be formed from numerous organic or inorganic insulators such as tape (polyimide), epoxy, silicone, glass (aramid) and ceramic. Organic insulators are preferred for low cost, high dielectric applications, whereas inorganic insulators are preferred when high thermal dissipation and a matched thermal coefficient of expansion are important.

The assemblies may also include an insulative adhesive that covers the routing lines and the connection joints, or alternatively, covers the side of the chip opposite the pads to enhance the mechanical coupling between the assemblies. Numerous adhesives can be applied. For instance, the adhesive can be applied as a paste, a laminated layer, or a liquid applied by screen-printing, spin-on, or spray-on. Thermosetting adhesive liquids and pastes such as epoxies are generally suitable. Likewise, thermoplastic adhesives are also generally suitable.

The package is well-suited for testing and rework. Preferably, the chips are "known good die" that are tested before the assemblies are stacked. After the assemblies are stacked and bonded together, but before the encapsulant is formed, the package can be tested to assure that the stacking has not damaged the assemblies. If a defective assembly is detected and reworkable conductive bonds (such as solder joints) are formed between the pillars, the package can be disassembled (such as by applying heat to render the solder joints molten), the defective assembly can be replaced, and then the package can be reassembled and retested. This enables significant cost savings since only the defective assembly rather than the entire package need be discarded. Furthermore, the package can be easily mounted in a test socket and no additional test rig is required.

After the package is formed, a soldering material or solder ball can be deposited over the lowermost pillar surfaces by plating or printing or placement techniques if required for the next level assembly. However, the next level assembly may not require that the package contain solder. For instance, in land grid array (LGA) packages, the soldering material is normally provided by the panel rather than the contact terminals on the package.

The "upper" and "lower" surfaces of the chip and the "top" and "bottom" surfaces of the routing lines do not depend on the orientation of the assembly, as will be readily apparent to those skilled in the art. For instance, the upper surface of the chip includes the pads and faces the bottom surfaces of the routing lines, and the top surfaces of the conductive traces face away from the chip, regardless of whether the assembly is inverted, stacked with other assemblies and/or mounted on a printed circuit board. Similarly, the routing lines are disposed "above" the chip when the bottom surfaces of the routing lines face the upper surface of the chip regardless of whether the assembly is inverted. Likewise, the routing lines are shown below the chip with a single orientation throughout the drawings for ease of comparison between the figures, although the assembly and its components may be inverted at various manufacturing stages.

Advantageously, the three-dimensional package of the present invention is reliable and inexpensive. The chips need not be specifically designed for stacking during wafer manufacturing. The pillars can be tapered to yield enhanced reliability for the next level assembly that exceeds that of conventional BGA packages. Furthermore, the pillars can be mechanically and metallurgically coupled together without wire bonding or TAB. The conductive bonds can be rendered non-solidified and deformed as the pillars are aligned to accommodate thickness variations in the assemblies. The conductive bonds can be reworkable to permit rework and reassembly. The encapsulant can hermetically seal the chips, protect against handling damage and provide a known dielectric barrier for the conductive traces without increasing the space between the assemblies. The package can have a TSOP, BGA, TCP, CSP or other packaging format as required by the next level assembly. As a result, the three-dimensional package of the present invention significantly enhances manufacturability, throughput, yield, performance characteristics, standardization and cost-effectiveness compared to conventional techniques.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A three-dimensional stacked semiconductor package, comprising:
   a first semiconductor chip assembly that includes a first semiconductor chip and a first conductive trace, wherein the first chip includes first and second opposing surfaces, the first surface of the first chip includes a first conductive pad, the first conductive trace includes a first routing line and a first pillar, the first routing line extends within and outside a periphery of the first chip and is electrically connected to the first pad, the first pillar includes first and second opposing surfaces and is disposed outside the periphery of the first chip and does not extend to the second surface of the first chip, and the first surface of the first pillar faces away from the first surface of the first chip;
   a second semiconductor chip assembly that includes a second semiconductor chip and a second conductive trace, wherein the second chip includes first and second opposing surfaces, the first surface of the second chip includes a second conductive pad, the second conductive trace includes a second routing line and a second pillar, the second routing line extends within and outside a periphery of the second chip and is electrically connected to the second pad, the second pillar includes first and second opposing surfaces and is disposed outside the periphery of the second chip and does not extend to the second surface of the second chip, and the first surface of the second pillar faces away from the first surface of the second chip; and
   a conductive bond that contacts and electrically connects the first and second pillars;
   wherein the first surface of the first chip faces the second surface of the second chip, the first surface of the first pillar faces the second surface of the second pillar, and the first surface of the first pillar is essentially coplanar with the first surface of the second chip.

2. The semiconductor package of claim 1, wherein the first conductive trace consists of the first routing line and the first pillar, and the second conductive trace consists of the second routing line and the second pillar.

3. The semiconductor package of claim 2, wherein the first conductive trace is a single continuous metal lead, and the second conductive trace is a single continuous metal lead.

4. The semiconductor package of claim 3, wherein the first routing line overlaps the first pad, and the second routing line overlaps the second pad.

5. The semiconductor package of claim 3, wherein the first pillar is disposed at a distal end of the first routing line, and the second pillar is disposed at a distal end of the second routing line.

6. The semiconductor package of claim 1, wherein the first and second conductive traces have essentially identical shapes and sizes.

7. The semiconductor package of claim 1, wherein the first conductive trace is a single continuous metal lead that consists of the first routing line and the first pillar, the second conductive trace is a single continuous metal lead that consists of the second routing line and the second pillar, the first routing line is essentially flat and coplanar with the first surface of the first chip and overlaps the first pad, the second routing line is essentially flat and coplanar with the first surface of the second chip and overlaps the second pad, the first pillar is disposed at a distal end of the first routing line, the second pillar is disposed at a distal end of the second routing line, and the first and second conductive traces have essentially identical shapes and sizes.

8. The semiconductor package of claim 1, wherein the first conductive trace is devoid of a pillar within the periphery of the first chip.

9. The semiconductor package of claim 8, wherein the second conductive trace includes another pillar within the periphery of the second chip.

10. The semiconductor package of claim 1, wherein the first routing line is essentially flat and parallel to the first surface of the first chip, and the second routing line is essentially flat and parallel to the first surface of the second chip.

11. The semiconductor package of claim 10, wherein the first routing line is essentially coplanar with the first surface of the first chip, and the second routing line is essentially coplanar with the first surface of the second chip.

12. The semiconductor package of claim 11, wherein the first routing line is contiguous with the first pillar, and the second routing line is contiguous with the second pillar.

13. The semiconductor package of claim 12, wherein the first routing line overlaps the first pad, and the second routing line overlaps the second pad.

14. The semiconductor package of claim 1, wherein the first routing line contacts the second surface of the second chip.

15. The semiconductor package of claim 1, wherein the first routing line contacts an adhesive that contacts the second surface of the second chip.

16. The semiconductor package of claim 1, wherein the second surface of the first pillar is essentially parallel to the first surface of the first chip, and the second surface of the second pillar is essentially parallel to the first surface of the second chip.

17. The semiconductor package of claim 16, wherein the second surface of the first pillar is essentially coplanar with the first surface of the first chip, and the second surface of the second pillar is essentially coplanar with the first surface of the second chip.

18. The semiconductor package of claim 1, wherein the first pillar extends orthogonally to the first and second surfaces of the first chip, and the second pillar extends orthogonally to the first and second surfaces of the second chip.

19. The semiconductor package of claim 1, wherein the first and second surfaces of the first pillar are separated by a first distance, the first and second surfaces of the second chip are separated by a second distance, and the first and second distances are essentially identical.

20. The semiconductor package of claim 1, wherein the first pillar does not extend to the first surface of the first chip, and the second pillar does not extend to the first surface of the second chip.

21. The semiconductor package of claim 1, wherein the first surface of the first pillar is essentially parallel to the second surface of the second pillar.

22. The semiconductor package of claim 1, wherein the first surface of the first pillar does not extend past the second surface of the second pillar.

23. The semiconductor package of claim 1, wherein the first surface of the first pillar is concentrically disposed within a surface area of the second surface of the first pillar, and the first surface of the second pillar is concentrically disposed within a surface area of the second surface of the second pillar.

24. The semiconductor package of claim 1, wherein the first surface of the first pillar is concentrically disposed within a surface area of the second surface of the second pillar.

25. The semiconductor package of claim 1, wherein the first surface of the first pillar contacts the second surface of the second pillar.

26. The semiconductor package of claim 1, wherein the first surface of the first pillar is separated from the second surface of the second pillar, and the conductive bond contacts and is sandwiched between the first surface of the first pillar and the second surface of the second pillar.

27. The semiconductor package of claim 1, wherein the first pillar is disposed at a distal end of the first routing line, and the second pillar is disposed at a distal end of the second routing line.

28. The semiconductor package of claim 1, wherein the first pillar has a conical shape in which its diameter increases from its first surface to its second surface, and the second pillar has a conical shape in which its diameter increases from its first surface to its second surface.

29. The semiconductor package of claim 1, wherein the first pillar has a larger diameter at its first surface than at its second surface, and the second pillar has a larger diameter at its first surface than at its second surface.

30. The semiconductor package of claim 1, wherein the conductive bond is disposed outside the peripheries of the first and second chips.

31. The semiconductor package of claim 1, wherein the conductive bond is the only material that contacts the first and second pillars.

32. The semiconductor package of claim 1, wherein the conductive bond is the only material that mechanically attaches the first and second conductive traces to one another.

33. The semiconductor package of claim 1, wherein the conductive bond and the first and second conductive traces are the only materials in an electrically conductive path between the first and second pads.

34. The semiconductor package of claim 1, wherein the conductive bond is selected from the group consisting of solder, conductive adhesive, conductive paste, electroplated metal, electrolessly plated metal, and a welded joint.

35. The semiconductor package of claim 1, wherein the first semiconductor chip assembly includes a first insulative adhesive between and in contact with the first pad and the first routing line, and the second semiconductor chip assembly includes a second insulative adhesive between and in contact with the second pad and the second routing line.

36. The semiconductor package of claim 1, wherein the first semiconductor chip assembly is essentially identical to the second semiconductor chip assembly.

37. The semiconductor package of claim 1, wherein the first surface of the first chip and the second surface of the second chip are separated from one another by at most 30 microns.

38. The semiconductor package of claim 1, including a single continuous encapsulant that contacts the first and second chips.

39. The semiconductor package of claim 1, including:
a third semiconductor chip assembly that includes a third semiconductor chip and a third conductive trace, wherein the third chip includes first and second opposing surfaces, the first surface of the third chip includes a third conductive pad, the third conductive trace includes a third routing line and a third pillar, the third routing line extends within and outside a periphery of the third chip and is electrically connected to the third pad, the third pillar includes first and second opposing surfaces and is disposed outside the periphery of the third chip and does not extend to the second surface of the third chip, and the first surface of the third pillar faces away from the first surface of the third chip; and
a second conductive bond that contacts and electrically connects the second and third pillars;
wherein the first surface of the second chip faces the second surface of the third chip, the first surface of the second pillar faces the second surface of the third pillar, and the first surface of the second pillar is essentially coplanar with the first surface of the third chip.

40. The semiconductor package of claim 1, wherein the package is devoid of wire bonds and TAB leads.

41. A three-dimensional stacked semiconductor package, comprising:
a first semiconductor chip assembly that includes a first semiconductor chip and a first conductive trace, wherein the first chip includes first and second opposing surfaces, the first surface of the first chip includes a first conductive pad, the first conductive trace includes a first routing line and a first pillar, the first routing line is essentially flat and coplanar with the first surface of the first chip and extends within and outside a periphery of the first chip and overlaps and is electrically connected to the first pad, the first pillar includes first and second opposing surfaces and is disposed outside the periphery of the first chip at a distal end of the first routing line and does not extend to the second surface of the first chip, the first surface of the first pillar faces away from the first surface of the first chip, and the second surface of the first pillar is essentially coplanar with the first surface of the first chip;

a second semiconductor chip assembly that includes a second semiconductor chip and a second conductive trace, wherein the second chip includes first and second opposing surfaces, the first surface of the second chip includes a second conductive pad, the second conductive trace includes a second routing line and a second pillar, the second routing line is essentially flat and coplanar with the first surface of the second chip and extends within and outside a periphery of the second chip at a distal end of the second routing line and overlaps and is electrically connected to the second pad, the second pillar includes first and second opposing surfaces and is disposed outside the periphery of the second chip and does not extend to the second surface of the second chip, the first surface of the second pillar faces away from the first surface of the second chip, and the second surface of the first pillar is essentially coplanar with the first surface of the second chip; and a conductive bond disposed outside the peripheries of the first and second chips that contacts and electrically connects the first and second pillars;

wherein the first surface of the first chip faces the second surface of the second chip, the first surface of the first pillar faces the second surface of the second pillar, the first surface of the first pillar is essentially coplanar with the first surface of the second chip, and the first and second pillars have essentially identical shapes and sizes.

42. The semiconductor package of claim 41, wherein the first conductive trace is a single continuous metal lead that consists of the first routing line and the first pillar, and the second conductive trace is a single continuous metal lead that consists of the second routing line and the second pillar.

43. The semiconductor package of claim 41, wherein the first conductive trace is devoid of a pillar within the periphery of the first chip, and the second conductive trace includes another pillar within the periphery of the second chip.

44. The semiconductor package of claim 41, wherein the first routing line contacts the second surface of the second chip.

45. The semiconductor package of claim 41, wherein the first pillar does not extend to the first surface of the first chip, and the second pillar does not extend to the first surface of the second chip.

46. The semiconductor package of claim 41, wherein the first surface of the first pillar does not extend past the second surface of the second pillar.

47. The semiconductor package of claim 41, wherein the first pillar has a diameter that increases from its first surface to its second surface, the second pillar has a diameter that increases from its first surface to its second surface, the first surface of the first pillar is concentrically disposed within a surface area of the second surface of the first pillar, the first surface of the second pillar is concentrically disposed within a surface area of the second surface of the second pillar, and the first surface of the first pillar is concentrically disposed within the surface area of the second surface of the second pillar.

48. The semiconductor package of claim 41, wherein the first semiconductor chip assembly includes a first insulative adhesive between and in contact with the first pad and the first routing line, and the second semiconductor chip assembly includes a second insulative adhesive between and in contact with the second pad and the second routing line.

49. The semiconductor package of claim 41, wherein the first semiconductor chip assembly is devoid of wire bonds and TAB leads, and the second semiconductor chip assembly is devoid of wire bonds and TAB leads.

50. The semiconductor package of claim 41, including:
a third semiconductor chip assembly that includes a third semiconductor chip and a third conductive trace, wherein the third chip includes first and second opposing surfaces, the first surface of the third chip includes a third conductive pad, the third conductive trace includes a third routing line and a third pillar, the third routing line is essentially flat and coplanar with the first surface of the third chip and extends within and outside a periphery of the third chip at a distal end of the third routing line and overlaps and is electrically connected to the third pad, the third pillar includes first and second opposing surfaces and is disposed outside the periphery of the third chip and does not extend to the second surface of the third chip, the first surface of the third pillar faces away from the first surface of the third chip, and the second surface of the third pillar is essentially coplanar with the first surface of the third chip; and a second conductive bond disposed outside the peripheries of the second and third chips that contacts and electrically connects the second and third pillars;

wherein the first surface of the second chip faces the second surface of the third chip, the first surface of the second pillar faces the second surface of the third pillar, the first surface of the second pillar is essentially coplanar with the first surface of the third chip, and the second and third conductive traces have essentially identical shapes and sizes.

51. A three-dimensional stacked semiconductor package, comprising:
a plurality of semiconductor chip assemblies, wherein each of the assemblies includes a semiconductor chip and a plurality of conductive traces, wherein the chip includes first and second opposing surfaces, the first surface includes a plurality of conductive pads, each of the conductive traces includes a routing line and a pillar, the routing line is essentially flat and extends within a periphery of the chip and overlaps and is electrically connected to a corresponding one of the pads, the routing line extends outside the periphery of the chip and is contiguous with the pillar, the pillar includes first and second opposing surfaces and is disposed outside the periphery of the chip and does not extend to the second surface of the chip, and the first surface of the pillar faces away from the first surface of the chip; and a plurality of conductive bonds disposed outside the peripheries of the chips that each contact and electrically connect corresponding pairs of the pillars on separate ones of the assemblies;

wherein for each of the assemblies, the chip is aligned with other chips in the package, and the pillars are aligned with other pillars in the package; and wherein for each of the assemblies above a lowest assembly in the package, the first surfaces of the pillars face the second surfaces of the pillars on the adjacent lower assembly, and the first surfaces of the pillars are essentially coplanar with the first surface of the chip on the adjacent lower assembly.

52. The semiconductor package of claim 51, wherein for each of the assemblies, each of the conductive traces is a single continuous metal lead that consists of the routing line and the pillar, the routing line is essentially flat and coplanar with the first surface of the chip, the pillar is disposed at a distal end of the routing line, and the second surface of the pillar is essentially coplanar with the first surface of the chip and does not extend to the second surface of the chip.

53. The semiconductor package of claim 51, wherein for each of the assemblies, an insulative adhesive is sandwiched between and contacts each pad and each routing line.

54. The semiconductor package of claim 51, wherein for each of the assemblies above the lowest assembly in the package, each routing line contacts the second surface of the adjacent lower chip.

55. The semiconductor package of claim 51, wherein for each of the assemblies above the lowest assembly in the package, the first surface of each pillar is essentially parallel to the second surface of the adjacent lower pillar.

56. The semiconductor package of claim 51, wherein for each of the assemblies above the lowest assembly in the package, each of the conductive traces is devoid of a pillar within the periphery of the chip, and for the lowest assembly in the package, each of the conductive traces includes another pillar within the periphery of the chip.

57. The semiconductor package of claim 51, wherein each pillar has a diameter that increases from its first surface to its second surface such that its first surface is concentrically disposed within a surface area of its second surface, and for each of the assemblies above the lowest assembly in the package, the first surface of each pillar is concentrically disposed within a surface area of the second surface of the adjacent lower pillar.

58. The semiconductor package of claim 51, including a single continuous encapsulant that contacts each of the routing lines, each of the pillars and each of the chips.

59. The semiconductor package of claim 51, wherein each of the assemblies is essentially identical to one another.

60. The semiconductor package of claim 51, wherein the package is devoid of wire bonds and TAB leads.

61. A method of making a three-dimensional stacked semiconductor package, comprising:

providing a first semiconductor chip assembly that includes a first semiconductor chip and a first conductive trace, wherein the first chip includes first and second opposing surfaces, the first surface of the first chip includes a first conductive pad, the first conductive trace includes a first routing line and a first pillar, the first routing line extends within and outside a periphery of the first chip and is electrically connected to the first pad, the first pillar includes first and second opposing surfaces and is disposed outside the periphery of the first chip, and the first surface of the first pillar faces away from the first surface of the first chip;

providing a second semiconductor chip assembly that includes a second semiconductor chip and a second conductive trace, wherein the second chip includes first and second opposing surfaces, the first surface of the second chip includes a second conductive pad, the second conductive trace includes a second routing line and a second pillar, the second routing line extends within and outside a periphery of the second chip and is electrically connected to the second pad, the second pillar includes first and second opposing surfaces and is disposed outside the periphery of the second chip, and the first surface of the second pillar faces away from the first surface of the second chip; then positioning the first and second assemblies such that the first surface of the first chip faces the second surface of the second chip, the first surface of the first pillar faces the second surface of the second pillar, and a bonding material is disposed between and contacts the first surface of the first pillar and the second surface of the second pillar; then moving the first and second assemblies towards one another while the bonding material is non-solidified such that the first surface of the first chip moves towards the second surface of the second chip, the first surface of the first pillar moves towards the second surface of the second pillar and the bonding material deforms; and then solidifying the bonding material to provide a conductive bond that contacts and electrically connects the first and second pillars.

62. The method of claim 61, wherein the first conductive trace is a single continuous metal lead that consists of the first routing line and the first pillar, the second conductive trace is a single continuous metal lead that consists of the second routing line and the second pillar, the first routing line is essentially flat and coplanar with the first surface of the first chip and overlaps the first pad, the second routing line is essentially flat and coplanar with the first surface of the second chip and overlaps the second pad, the first pillar is disposed at a distal end of the first routing line, the second pillar is disposed at a distal end of the second routing line, and the first and second conductive traces have essentially identical shapes and sizes.

63. The method of claim 61, wherein the first conductive trace is devoid of a pillar within the periphery of the first chip, and the second conductive trace includes another pillar within the periphery of the second chip.

64. The method of claim 61, wherein the first assembly contacts the second surface of the second chip after moving the assemblies towards one another.

65. The method of claim 61, wherein the first surface of the first pillar is essentially coplanar with the first surface of the second chip after solidifying the bonding material.

66. The method of claim 61, wherein the first pillar does not extend to the second surface of the first chip, and the second pillar does not extend to the second surface of the second chip after solidifying the bonding material.

67. The method of claim 61, wherein the first pillar has a diameter that increases from its first surface to its second surface, the second pillar has a diameter that increases from its first surface to its second surface, the first surface of the first pillar is concentrically disposed within a surface area of the second surface of the first pillar, the first surface of the second pillar is concentrically disposed within a surface area of the second surface of the second pillar, and after positioning the first and second assemblies, the first surface of the first pillar is concentrically disposed within the surface area of the second surface of the second pillar.

68. The method of claim 61, wherein the bonding material is solder paste and the conductive bond is solder.

69. The method of claim 61, including forming an encapsulant on the first and second routing lines, the first and second pillars and the first and second chips after solidifying the bonding material.

70. The method of claim 61, wherein the package is devoid of wire bonds and TAB leads.

71. A method of making a three-dimensional stacked semiconductor package, comprising:

providing a first semiconductor chip assembly that includes a first semiconductor chip and a first conductive trace, wherein the first chip includes first and second opposing surfaces, the first surface of the first chip includes a first conductive pad, the first conductive trace includes a first routing line and a first pillar, the first routing line is essentially flat and coplanar with the first surface of the first chip and extends within and outside a periphery of the first chip and overlaps and is electrically connected to the first pad, the first pillar includes first and second opposing surfaces and is disposed outside the periphery of the first chip at a distal end of the first routing line and does not extend to the second surface of the first chip, the first surface of the first pillar faces away from the first surface of the first chip, and the second surface of the first pillar is essentially coplanar with the first surface of the first chip;

providing a second semiconductor chip assembly that includes a second semiconductor chip and a second conductive trace, wherein the second chip includes first and second opposing surfaces, the first surface of the second chip includes a second conductive pad, the second conductive trace includes a second routing line and a second pillar, the second routing line is essentially flat and coplanar with the first surface of the second chip and extends within and outside a periphery of the second chip at a distal end of the second routing line and overlaps and is electrically connected to the second pad, the second pillar includes first and second opposing surfaces and is disposed outside the periphery of the second chip and does not extend to the second surface of the second chip, the first surface of the second pillar faces away from the first surface of the second chip, and the second surface of the first pillar is essentially coplanar with the first surface of the second chip; then positioning the first and second assemblies such that the first surface of the first chip faces the second surface of the second chip, the first surface of the first pillar faces the second surface of the second pillar, and a bonding material is disposed between and contacts the first surface of the first pillar and the second surface of the second pillar; then applying pressure while the bonding material is non-solidified such that the first surface of the first chip moves towards the second surface of the second chip, the first surface of the first pillar moves towards the second surface of the second pillar and the bonding material deforms until the first assembly contacts the second surface of the second chip, at which time the first surface of the first pillar is essentially coplanar with the first surface of the first chip and separated from the second surface of the second pillar by the bonding material; and then solidifying the bonding material to provide a conductive bond that contacts and electrically connects the first and second pillars.

72. The method of claim 71, wherein the first conductive trace is a single continuous metal lead that consists of the first routing line and the first pillar, the second conductive trace is a single continuous metal lead that consists of the second routing line and the second pillar, and the first and second conductive traces have essentially identical shapes and sizes.

73. The method of claim 71, wherein the first conductive trace is devoid of a pillar within the periphery of the first chip, and the second conductive trace includes another pillar within the periphery of the second chip.

74. The method of claim 71, wherein the first routing line contacts the second surface of the second chip after applying the pressure.

75. The method of claim 71, wherein the first pillar does not extend to the first surface of the first chip, and the second pillar does not extend to the first surface of the second chip.

76. The method of claim 71, wherein the first pillar has a diameter that increases from its first surface to its second surface, the second pillar has a diameter that increases from its first surface to its second surface, the first surface of the first pillar is concentrically disposed within a surface area of the second surface of the first pillar, the first surface of the second pillar is concentrically disposed within a surface area of the second surface of the second pillar, and after positioning the assemblies, the first surface of the first pillar is concentrically disposed within the surface area of the second surface of the second pillar.

77. The method of claim 71, wherein the first semiconductor chip assembly includes a first insulative adhesive between and in contact with the first pad and the first routing line, and the second semiconductor chip assembly includes a second insulative adhesive between and in contact with the second pad and the second routing line.

78. The method of claim 71, wherein the bonding material is solder paste, the conductive bond is solder, and solidifying the bonding material to form the conductive bond includes applying heat to reflow solder particles in the solder paste without applying pressure to the package.

79. The method of claim 71, including forming an encapsulant on the first and second routing lines, the first and second pillars and the first and second chips after solidifying the bonding material.

80. The method of claim 71, wherein the package is devoid of wire bonds and TAB leads.

81. A method of making a three-dimensional stacked semiconductor package, comprising:

providing a plurality of semiconductor chip assemblies, wherein each of the assemblies includes a semiconductor chip and a plurality of conductive traces, wherein the chip includes first and second opposing surfaces, the first surface includes a plurality of conductive pads, each of the conductive traces includes a routing line and a pillar, the routing line is essentially flat and extends within a periphery of the chip and overlaps and is electrically connected to a corresponding one of the pads, the routing line extends outside the periphery of the chip and is contiguous with the pillar, the pillar includes first and second opposing surfaces and is disposed outside the periphery of the chip and does not extend to the second surface of the chip, and the first surface of the pillar faces away from the first surface of the chip; and stacking the assemblies such that the chips are aligned with one another, the pillars are aligned with one another, conductive bonds outside the peripheries of the chips contact and electrically connect corresponding pairs of the pillars on separate ones of the assemblies, and for each of the assemblies above a lowest assembly in the package, the first surface of the chip faces the second surface of the adjacent lower chip, the first surface of the pillar faces the second surface of the adjacent lower pillar, and the first surface of the pillar is essentially coplanar with the first surface of the adjacent lower chip.

82. The method of claim 81, wherein for each of the assemblies, each of the conductive traces is a single continuous metal lead that consists of the routing line and the pillar, the routing line is essentially flat and coplanar with the first surface of the chip, the pillar is disposed at a distal end of the routing line, and the second surface of the pillar is essentially coplanar with the first surface of the chip and does not extend to the second surface of the chip.

83. The method of claim 81, wherein for each of the assemblies, an insulative adhesive is sandwiched between and contacts each pad and each routing line.

84. The method of claim 81, wherein for each of the assemblies above the lowest assembly in the package, each routing line contacts the second surface of the adjacent lower chip.

85. The method of claim 81, wherein for each of the assemblies above the lowest assembly in the package, the first surface of each pillar is essentially parallel to the second surface of the adjacent lower pillar.

86. The method of claim 81, wherein for each of the assemblies above the lowest assembly in the package, each of the conductive traces is devoid of a pillar within the periphery of the chip, and for the lowest assembly in the package, each of the conductive traces includes another pillar within the periphery of the chip.

87. The method of claim 81, wherein each pillar has a diameter that increases from its first surface to its second surface such that its first surface is concentrically disposed within a surface area of its second surface, and for each of the assemblies above the lowest assembly in the package, the first surface of each pillar is concentrically disposed within a surface area of the second surface of the adjacent lower pillar.

88. The method of claim 81, including forming an encapsulant that contacts each of the routing lines, each of the pillars and each of the chips after stacking the assemblies.

89. The method of claim 81, wherein each of the assemblies is essentially identical to one another.

90. The method of claim 81, wherein the package is devoid of wire bonds and TAB leads.

* * * * *

UNITED STATES PATENT AND TRADEMARK OFFICE
CERTIFICATE OF CORRECTION

PATENT NO. : 6,451,626 B1
DATED : September 17, 2002
INVENTOR(S) : Charles W.C. Lin It is certified that error appears in the above-identified patent and that said Letters Patent is hereby corrected as shown below:

Column 10,
Line 48, change "and chip" to -- of chip --.

Column 21,
Line 17, delete "at a distal end of the second routing line";
Line 21, after "second chip" insert -- at a distal end of the second routing line --;
Line 24, change "first pillar" to -- second pillar --.

Column 22,
Lines 18-19, delete "at a distal end of the third routing line";
Line 22, after "third chip" insert -- at a distal end of the third routing line --.
Line 43, after "surface" insert -- of the chip --.

Column 25,
Lines 26-27, delete "at a distal end of the second routing line";
Line 30, after "second chip" insert -- at a distal end of the second routing line --;
Line 33, change "first pillar" to -- second pillar --;
Line 51, change "first chip" to -- second chip --.

Column 26,
Line 41, after "first surface" insert -- of the chip --.

Signed and Sealed this

Twenty-fourth Day of December, 2002

JAMES E. ROGAN
*Director of the United States Patent and Trademark Office*